United States Patent
Hosokawa et al.

(10) Patent No.: US 6,708,315 B2
(45) Date of Patent: Mar. 16, 2004

(54) METHOD OF DESIGN FOR TESTABILITY, METHOD OF DESIGN FOR INTEGRATED CIRCUITS AND INTEGRATED CIRCUITS

(75) Inventors: Toshinori Hosokawa, Tokyo (JP); Masayoshi Yoshimura, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/789,524

(22) Filed: Feb. 22, 2001

(65) Prior Publication Data

US 2002/0129322 A1 Sep. 12, 2002

(30) Foreign Application Priority Data

Feb. 24, 2000 (JP) .......................... 2000-047044
Jul. 26, 2000 (JP) .......................... 2000-225574

(51) Int. Cl.$^7$ .............................. G06F 17/50
(52) U.S. Cl. ................... 716/4; 716/2; 716/11
(58) Field of Search ................ 714/718; 365/201; 716/2, 4, 11

(56) References Cited

U.S. PATENT DOCUMENTS 5,539,652 A * 7/1996 Tegethoff .................. 716/4
5,809,039 A * 9/1998 Takahashi et al. .......... 714/718
5,809,040 A * 9/1998 Dallmann et al. .......... 365/201
6,080,203 A * 6/2000 Njinda et al. ............... 716/4

OTHER PUBLICATIONS

"Accelerated Test Points Selection Method for Scan–Based BIST," by Nakao et al., IEEE 1997 Asian Test Symposium (1997), pp. 359–364.

"Digital Systems Testing and Testable Design," Publication by Computer Science Press (1996), Chapter 9: Design for Testability, pp. 343–395.

"An RT Level Partial Scan Design Method Based on Combinational ATPG," by Inoue et al., Technical Report of IEICE (Feb. 1997), pp. 73–80.

\* cited by examiner

Primary Examiner—Matthew Smith
Assistant Examiner—Thuan Do
(74) Attorney, Agent, or Firm—McDermott, Will & Emery

(57) ABSTRACT

A design for testability is applied so as to enable significant reduction in test time of an actual integrated circuit. First, an integrated circuit is full-scan designed on a block-by-block basis and test input patterns are generated (S11). Then, one of the blocks to which the design for testability has not been allocated is selected (S12), and a full-scan design is allocated thereto (S14). Test points are inserted into a block that has more than a prescribed number of parallel test input patterns when that block is full-scan designed (YES in S15) (S16).

22 Claims, 44 Drawing Sheets

AFTER FULL-SCAN DESIGN

| BLOCK | NUMBER OF SCAN FFS | NUMBER OF TEST INPUTS |
|---|---|---|
| A | 10000 | 300 |
| B | 7000 | 150 |
| C | 8000 | 2000 |
| D | 15000 | 1000 |

→ (BLOCK OF INTEREST)

AFTER TEST-POINT INSERTION

| BLOCK | NUMBER OF SCAN FFS | NUMBER OF TEST INPUTS |
|---|---|---|
| C | 8160 | 1200 |

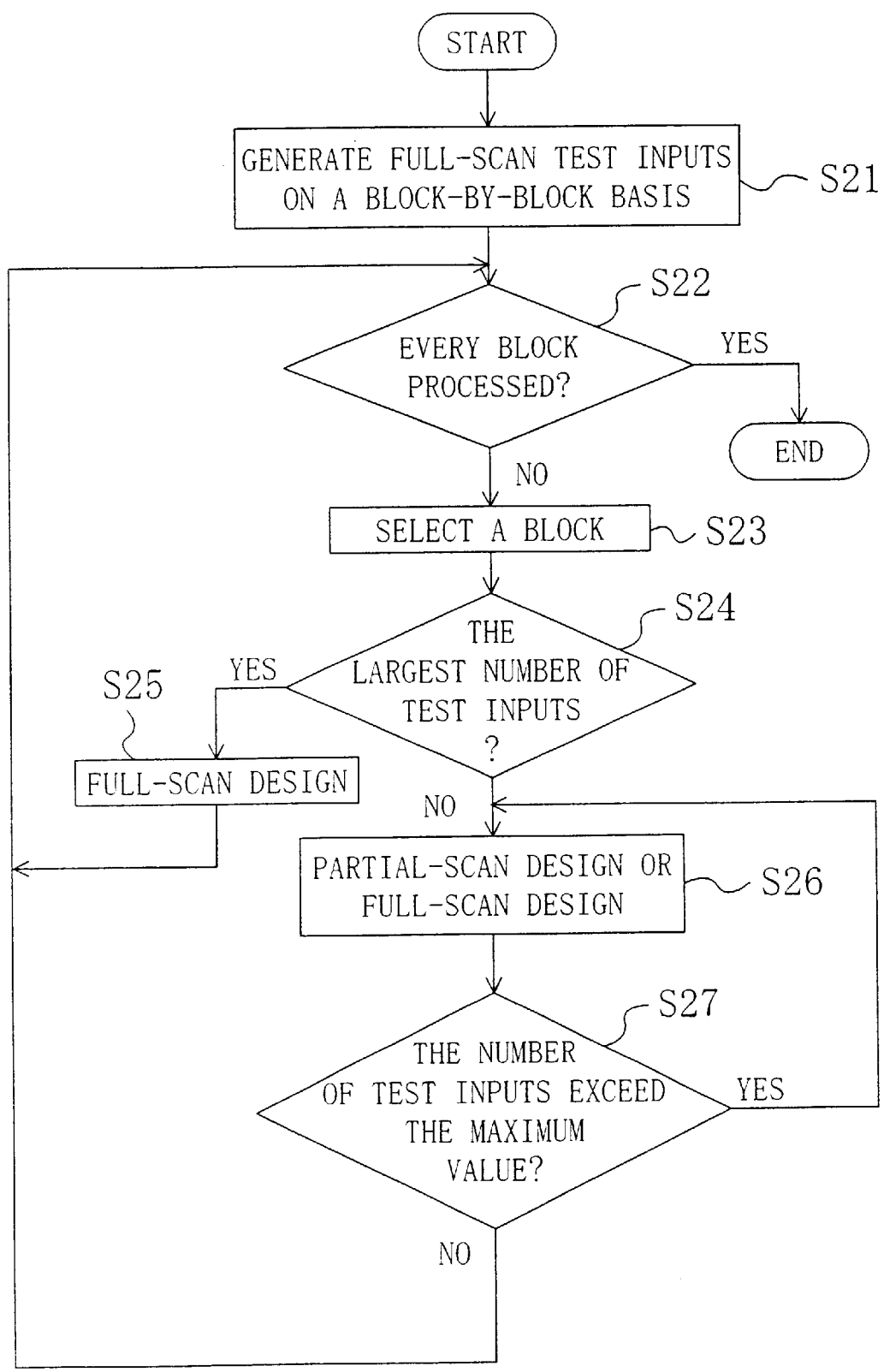

FIG. 4A

BLOCK A

| NUMBER OF SCAN FFS | NUMBER OF TEST INPUTS | |
|---|---|---|
| 1000 | 3000 | NG (>2000) |
| 3000 | 1500 | ← EMPLOYED |

FIG. 4B

BLOCK B

| NUMBER OF SCAN FFS | NUMBER OF TEST INPUTS | |
|---|---|---|
| 3000 | 700 | ← EMPLOYED |

FIG. 4C

BLOCK D

| NUMBER OF SCAN FFS | NUMBER OF TEST INPUTS | |
|---|---|---|
| 5000 | 7000 | NG (>2000) |
| 8000 | 5000 | |
| 10000 | 3000 | |
| 12000 | 1800 | ← EMPLOYED |

FIG. 6A

BLOCK A

| NUMBER OF SCAN FFS | NUMBER OF TEST INPUTS | |
|---|---|---|
| 1000 | 3000 | ⎫ |
| 3000 | 1500 | ⎬ NG (>1200) |
| 4000 | 1300 | ⎭ |
| 5000 | 1100 | ← EMPLOYED |

FIG. 6B

BLOCK B

| NUMBER OF SCAN FFS | NUMBER OF TEST INPUTS | |
|---|---|---|
| 3000 | 700 | ← EMPLOYED |

FIG. 6C

BLOCK D

| NUMBER OF SCAN FFS | NUMBER OF TEST INPUTS | |
|---|---|---|
| 5000 | 7000 | ⎫ |
| 8000 | 5000 | ⎬ |
| 10000 | 3000 | ⎬ NG (>1200) |
| 12000 | 1800 | ⎭ |
| 13000 | 1150 | ← EMPLOYED |

| EXTERNAL OUTPUT | ACCESSIBLE GATE | FAULT COVERAGE |
|---|---|---|
| PO1 | A, [B], C, D | $\frac{3+1/2}{15} \approx 23.3\%$ |
| PO2 | [B], E, F, H [J][K][M][N] | $\frac{3+(1/2)\times 5}{15} \approx 36.7\%$ |
| PO3 | G, I, [J][K] L, [M][N], O | $\frac{4+(1/2)\times 4}{15} \approx 40\%$ |

| EXTERNAL OUTPUT | ACCESSIBLE EXTERNAL INPUT |
|---|---|
| PO2 | PI2, (PI3)(PI4) (PI5)(PI6) |
| PO3 | (PI3)(PI4)(PI5)(PI6) PI7, PI8, PI9 |

☆ : TEST-POINT
INSERTION POSITION

| EXTERNAL OUTPUT | ACCESSIBLE GATE | FAULT COVERAGE | | |
|---|---|---|---|---|
| PO1 | A, B, C, D | $\frac{3+1/2}{15}$ | ≒ | 23.3% |
| PO2 | B, E, F, H, J, K, M, N | $\frac{3+5/2}{15}$ | ≒ | 36.7% |
| PO3 | G, I, L, O | $\frac{4}{15}$ | ≒ | 26.7% |
| PO4 | K, N | $\frac{2/2}{15}$ | ≒ | 6.7% |
| PO5 | J, M | $\frac{2/2}{15}$ | ≒ | 6.7% |

| EXTERNAL OUTPUT | ACCESSIBLE GATE | FAULT COVERAGE |
|---|---|---|
| PO1 | A, B, C, D̄ F G, I | $\frac{6+1/2}{9} \fallingdotseq 72.2\%$ |
| PO2 | D̄ E, H | $\frac{2+1/2}{9} \fallingdotseq 27.8\%$ |

☆: TEST-POINT INSERTION POSITION

☆: TEST-POINT INSERTION POSITION

| EXTERNAL OUTPUT | ACCESSIBLE GATE | FAULT COVERAGE |
|---|---|---|
| PO1 | C, [D], G, I | $\frac{6+1/2}{9} \approx 38.9\%$ |
| PO2 | [D], E, H | $\frac{2+1/2}{9} \approx 27.8\%$ |
| PO3 | A, F | $\frac{2}{9} \approx 22.2\%$ |
| PO4 | [B] | $\frac{1}{9} \approx 11.1\%$ |

| EXTERNAL OUTPUT | ACCESSIBLE GATE | FAULT COVERAGE | |
|---|---|---|---|
| PO1 | A, F, I, G, C | $\frac{5}{9}$ | ≒ 55.6% |
| PO2 | E, H | $\frac{2}{9}$ | ≒ 22.2% |
| PO3 | B | $\frac{1}{9}$ | ≒ 11.1% |
| PO4 | D | $\frac{1}{9}$ | ≒ 11.1% |

| EXTERNAL OUTPUT | ACCESSIBLE GATE | FAULT COVERAGE |
|---|---|---|
| PO1 | A, B, H | $\frac{1+\frac{1}{2}+\frac{1}{3}}{10} = 18.3$ |
| PO2 | A, B, C, D, G, I | $\frac{1+\frac{1}{2}\times 4+\frac{1}{3}}{10} = 33.3$ |
| PO3 | B, C, D, E, F, G, J | $\frac{3+\frac{1}{2}\times 3+\frac{1}{3}}{10} = 48.3$ |

| EXTERNAL INPUT | ACCESSIBLE EXTERNAL OUTPUT | VALUE-ASSIGNMENT PROBABILITY |
|---|---|---|
| PI1 | PO1, PO2 | 51.6 |
| PI2, PI3, PI4 | PO1, PO2, PO3 | 100 |
| PI5, PI6, PI7 | PO2, PO3 | 81.6 |
| PI8 | PO3 | 48.3 |

| INSERTION POSITION | MAXIMUM VALUE OF VALUE-ASSIGNMENT PROBABILITY |
|---|---|
| ①~⑰, ⑲~㉑, ㉗, ㉚~㉜ | 100 |
| ⑱ | 85 |
| ㉒, ㉕ | 90 |
| ㉓ | 95 |
| ㉔ | 96.7 |
| ㉖ | 65 |
| ㉘ | 83.3 |
| ㉙ | 81.7 |

FIG. 27A

| EXTERNAL OUTPUT | ACCESSIBLE GATE | FAULT COVERAGE |
|---|---|---|
| PO1 | A, B, H | $\frac{\frac{1}{2} \times 2 + 1}{10} = 20$ |
| PO2 | A, I | $\frac{\frac{1}{2} \times 1 + 1}{10} = 15$ |
| PO3 | D, E, F, J | $\frac{1 \times 3 + \frac{1}{2} \times 1}{10} = 35$ |
| PO4 | B, C, D | $\frac{1 + \frac{1}{2} \times 2}{10} = 20$ |

FIG. 27B

| EXTERNAL INPUT | ACCESSIBLE EXTERNAL OUTPUT | VALUE-ASSIGNMENT PROBABILITY |
|---|---|---|
| PI1 | PO1, PO2 | 35 |
| PI2 | PO1, PO2, PO4 | 65 |
| PI3, PI4 | PO1, PO4 | 40 |
| PI5 | PO4 | 20 |
| PI6, PI7 | PO3, PO4 | 55 |
| PI8 | PO3 | 35 |
| PI9 | PO2, PO3 | 50 |

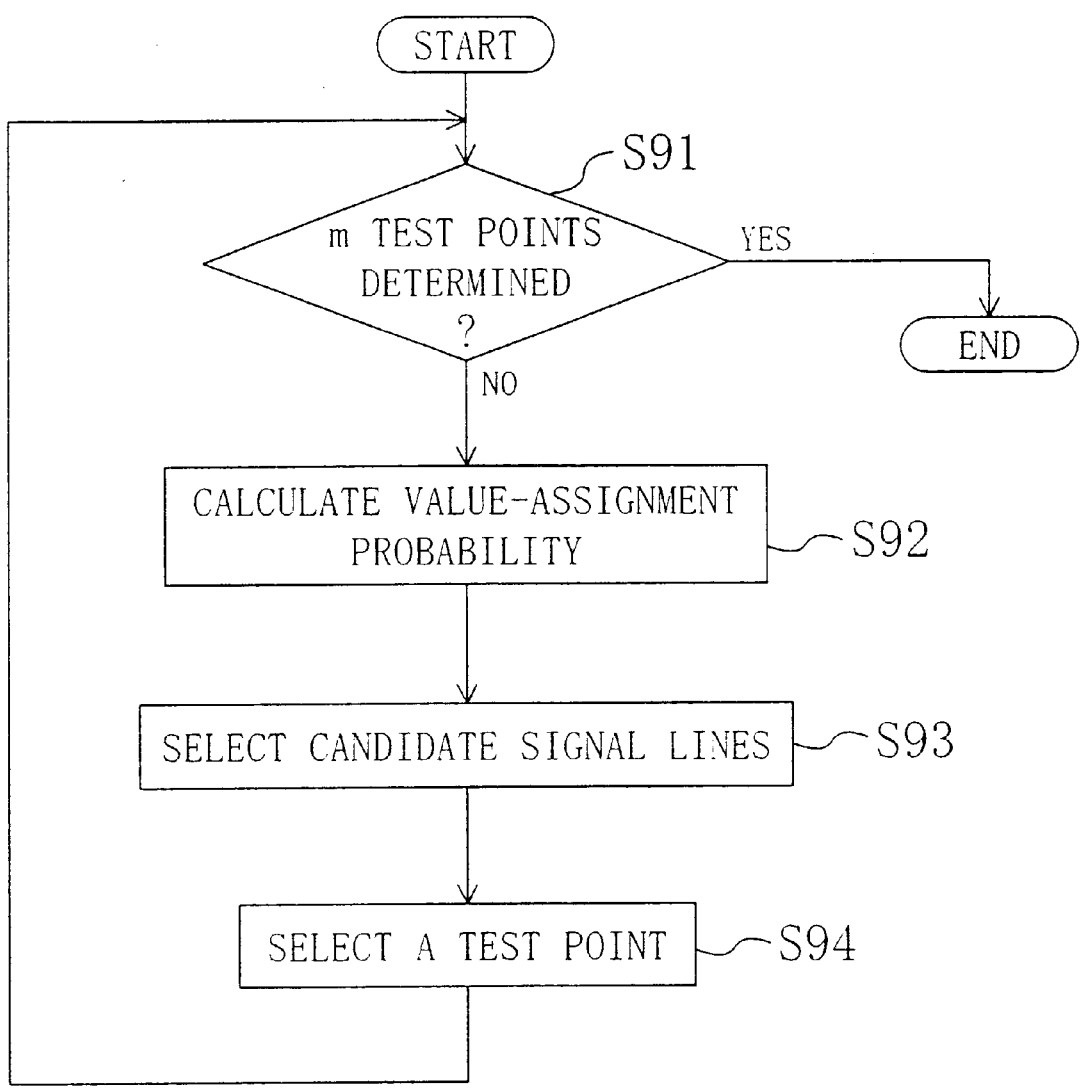

FIG. 32A

| FAULT COVERAGE OF PO1 | 31.66% |
|---|---|
| FAULT COVERAGE OF PO2 | 24.26% |
| FAULT COVERAGE OF PO3 | 22.04% |
| FAULT COVERAGE OF PO4 | 22.04% |

FIG. 32B

| VALUE-ASSIGNMENT PROBABILITY OF PI1 | 31.66% |
|---|---|
| VALUE-ASSIGNMENT PROBABILITY OF PI2 | 55.92% |
| VALUE-ASSIGNMENT PROBABILITY OF PI3 | 68.89% |
| VALUE-ASSIGNMENT PROBABILITY OF PI4 | 68.89% |
| VALUE-ASSIGNMENT PROBABILITY OF PI5 | 68.89% |
| VALUE-ASSIGNMENT PROBABILITY OF PI6 | 100% |
| VALUE-ASSIGNMENT PROBABILITY OF PI7 | 22.04% |

FIG. 33

| REPRESENTATIVE SIGNAL LINE | ACCESSIBLE EXTERNAL OUTPUT | | | | CALCULATED COST VALUE |
|---|---|---|---|---|---|
| n2 | P01 | | P02 | | 168.51 |
| ACCESSIBLE EXTERNAL INPUT (≧ THRESHOLD VALUE) | PI2, PI6 | | PI2, PI3, PI4, PI5, PI6 | | |
| n4 | P02 | P03 | PI3, PI4, PI5, PI6 | P04 | 325.93 |
| ACCESSIBLE EXTERNAL INPUT (≧ THRESHOLD VALUE) | PI2, PI3, PI4, PI5, PI6 | PI3, PI4, PI5, PI6 | | | |
| n17 | P01 | | P02 | | 168.51 |
| ACCESSIBLE EXTERNAL INPUT (≧ THRESHOLD VALUE) | PI2, PI6 | | PI2, PI3, PI4, PI5, PI6 | | |
| n27 | P02 | P03 | PI3, PI4, PI5, PI6 | P04 | 325.93 |
| ACCESSIBLE EXTERNAL INPUT (≧ THRESHOLD VALUE) | PI2, PI3, PI4, PI5, PI6 | PI3, PI4, PI5, PI6 | | | |
| n28 | PI3, PI4, PI5, PI6 | PI3, PI4, PI5, PI6 | P04 | | 213.34 |
| ACCESSIBLE EXTERNAL INPUT (≧ THRESHOLD VALUE) | | | | | |
| n35 | P01 | | P02 | | 168.51 |
| ACCESSIBLE EXTERNAL INPUT (≧ THRESHOLD VALUE) | PI2, PI6 | | PI2, PI3, PI4, PI5, PI6 | | |
| n38 | P02 | | P03 | | 219.26 |
| ACCESSIBLE EXTERNAL INPUT (≧ THRESHOLD VALUE) | PI2, PI3, PI4, PI5, PI6 | | PI3, PI4, PI5, PI6 | | |

FIG. 34

| CANDIDATE SIGNAL LINE | ACCESSIBLE EXTERNAL INPUT (≧ THRESHOLD VALUE) | | CALCULATED COST VALUE |
|---|---|---|---|
| n4 | PI4 | | 68.89 |
| NO-LONGER ACCESSIBLE EXTERNAL OUTPUT | PO2, PO3, PO4 | | |
| n27 | PI3 | PI4 | PI5 | 206.67 |
| NO-LONGER ACCESSIBLE EXTERNAL OUTPUT | PO2, PO3, PO4 | PO2, PO3, PO4 | PO2, PO3, PO4 | |
| n38 | PI3 | PI4 | PI5 | 138.90 |
| NO-LONGER ACCESSIBLE EXTERNAL OUTPUT | PO2, PO3 | PO2, PO3 | PO2, PO3 | |

FIG. 36A

| FAULT COVERAGE OF PO1 | 30.98% |
|---|---|
| FAULT COVERAGE OF PO2 | 18.66% |
| FAULT COVERAGE OF PO3 | 16.48% |
| FAULT COVERAGE OF PO4 | 16.48% |
| FAULT COVERAGE OF PO5 | 17.40% |

FIG. 36B

| VALUE-ASSIGNMENT PROBABILITY OF PI1 | 30.98% |
|---|---|
| VALUE-ASSIGNMENT PROBABILITY OF PI2 | 49.64% |
| VALUE-ASSIGNMENT PROBABILITY OF PI3 | 17.40% |
| VALUE-ASSIGNMENT PROBABILITY OF PI4 | 17.40% |
| VALUE-ASSIGNMENT PROBABILITY OF PI5 | 17.40% |
| VALUE-ASSIGNMENT PROBABILITY OF PI6 | 82.60% |
| VALUE-ASSIGNMENT PROBABILITY OF PI7 | 16.48% |
| VALUE-ASSIGNMENT PROBABILITY OF PI8 | 51.62% |

FIG. 37

| REPRESENTATIVE SIGNAL LINE | ACCESSIBLE EXTERNAL OUTPUT | | CALCULATED COST VALUE |
|---|---|---|---|
| n2 | P01 | P02 | 66.82 |
| ACCESSIBLE EXTERNAL INPUT (≧ THRESHOLD VALUE) | PI6 | PI6, PI8 | |
| n17 | P01 | P02 | 66.82 |
| ACCESSIBLE EXTERNAL INPUT (≧ THRESHOLD VALUE) | PI6 | PI6, PI8 | |
| n28 | P03 | P04 | 68.44 |
| ACCESSIBLE EXTERNAL INPUT (≧ THRESHOLD VALUE) | PI6, PI8 | PI6, PI8 | |
| n35 | P01 | P02 | 66.82 |
| ACCESSIBLE EXTERNAL INPUT (≧ THRESHOLD VALUE) | PI6 | PI6, PI8 | |
| n38 | P02 | P03 | 68.44 |
| ACCESSIBLE EXTERNAL INPUT (≧ THRESHOLD VALUE) | PI6, PI8 | PI6, PI8 | |

FIG. 38

| CANDIDATE SIGNAL LINE | ACCESSIBLE EXTERNAL INPUT (≥ THRESHOLD VALUE) | CALCULATED COST VALUE |
|---|---|---|
| n2 | NONE | 0 |
| NO-LONGER ACCESSIBLE EXTERNAL OUTPUT | NONE | |
| n17 | NONE | 0 |
| NO-LONGER ACCESSIBLE EXTERNAL OUTPUT | NONE | |
| n28 | PI6 | 32.96 |
| NO-LONGER ACCESSIBLE EXTERNAL OUTPUT | PO3, PO4 | |
| n35 | PI6 | 49.64 |
| NO-LONGER ACCESSIBLE EXTERNAL OUTPUT | PO1, PO2 | |
| n38 | PI8 | 35.14 |
| NO-LONGER ACCESSIBLE EXTERNAL OUTPUT | PO2, PO3 | |

FIG. 40A

| | |
|---|---|
| FAULT COVERAGE OF PO1 | 25.53% |
| FAULT COVERAGE OF PO2 | 10.28% |
| FAULT COVERAGE OF PO3 | 16.67% |
| FAULT COVERAGE OF PO4 | 16.67% |
| FAULT COVERAGE OF PO5 | 17.02% |
| FAULT COVERAGE OF PO6 | 13.83% |

FIG. 40B

| | |
|---|---|
| VALUE-ASSIGNMENT PROBABILITY OF PI1 | 25.53% |
| VALUE-ASSIGNMENT PROBABILITY OF PI2 | 39.36% |
| VALUE-ASSIGNMENT PROBABILITY OF PI3 | 17.02% |
| VALUE-ASSIGNMENT PROBABILITY OF PI4 | 17.02% |
| VALUE-ASSIGNMENT PROBABILITY OF PI5 | 17.02% |
| VALUE-ASSIGNMENT PROBABILITY OF PI6 | 47.17% |
| VALUE-ASSIGNMENT PROBABILITY OF PI7 | 16.67% |
| VALUE-ASSIGNMENT PROBABILITY OF PI8 | 43.62% |
| VALUE-ASSIGNMENT PROBABILITY OF PI9 | 35.81% |

CK ⟶ TO CLOCK OF SCAN FF1 TO FF4
SE ⟶ TO SE OF SCAN FF1 TO FF4

FIG. 43

| | EXTERNAL INPUTS | | | | | | | EXPECTED VALUES OF EXTERNAL OUTPUTS | | | | | |
|---|---|---|---|---|---|---|---|---|---|---|---|---|---|
| | PI1 | PI2 | PI3 | PPI-FF1 | PPI-FF2 | PPI-FF3 | PPI-FF4 | PO1 | PO2 | PPO-FF1 | PPO-FF2 | PPO-FF3 | PPO-FF4 |
| $V_1$ | 0 | 1 | 0 | 1 | 0 | 1 | 0 | H | L | H | H | L | L |
| $V_2$ | 1 | 1 | 1 | 0 | 1 | 0 | 1 | H | H | L | H | H | L |

FIG. 44

| SCAN-IN | EXTERNAL INPUT | | | CLOCK | MODE | EXTERNAL OUTPUT | | EXTERNAL SCAN-OUT | |
|---|---|---|---|---|---|---|---|---|---|
| SI | PI1 | PI2 | PI3 | CK | SE | PO1 | PO2 | SO | |
| 1 | — | — | — | ↑ | 1 | * | * | * | ⎱ RANDOM INPUT |
| 1 | — | — | — | ↑ | 1 | * | * | H | |
| 0 | — | — | — | ↑ | 1 | * | * | H | |
| 0 | — | — | — | ↑ | 1 | * | * | L | ⎰ |
| — | — | — | — | ↑ | 1 | * | * | * | ⎱ EXPECTED VALUES OF V2 |
| 0 | — | — | — | ↑ | 1 | * | * | L | |
| 1 | — | — | — | ↑ | 1 | * | * | H | |
| 0 | 1 | 1 | 1 | ↑ | 0 CAPTURE MODE | H | H | * | ⎰ CORRESPONDING TO V2 |
| 1 | — | — | — | ↑ | 1 | * | * | H | ⎱ EXPECTED VALUES OF V1 |
| 0 | — | — | — | ↑ | 1 | * | * | H | |
| 1 | — | — | — | ↑ | 1 | * | * | L | |
| 0 | 0 | 1 | 0 | ↑ | 0 CAPTURE MODE | H | L | * | ⎰ CORRESPONDING TO V1 |
| 1 | — | — | — | ↑ | 1 | * | * | * | |
| 0 | — | — | — | ↑ | 1 | * | * | * | |
| 1 | — | — | — | ↑ | 1 | * | * | * | |
| 0 | — | — | — | ↑ | 1 | * | * | * | |

US 6,708,315 B2

1

METHOD OF DESIGN FOR TESTABILITY, METHOD OF DESIGN FOR INTEGRATED CIRCUITS AND INTEGRATED CIRCUITS

BACKGROUND OF THE INVENTION

The present invention relates to a design for testability technique for facilitating generation of test input patterns for fault testing of integrated circuits.

One of the conventional methods of design for testability for integrated circuits is a full-scan design method (see "Digital Systems Testing and Testable Design," Computer Science Press, Chapter 9, pp. 343–395, 1990).

According to the full-scan design, all FFs (flip-flops) in the circuit are replaced with scan FFS, which are connected in the form of a shift register. Since the values of the FFs can be arbitrarily set and read through the shift register during testing, the scan FFs can be regarded as external inputs/outputs (I/Os). Therefore, for the full-scan design circuits, test input patterns achieving a high fault coverage can be easily generated with a combinational test input pattern generation algorithm.

Another example of the conventional methods of design for testability is a partial-scan design method. According to the partial-scan design, a part of the FFs in the circuit is replaced with scan FFs, which are connected in the form of a shift register. The partial scan design can reduce the area overhead, degradation in delay, and power consumption as compared to the full-scan design, but generally requires a sequential test input pattern generation algorithm to generate test input patterns. A method for selecting FFs to be replaced with scan FFs is of importance for a high fault coverage.

A method for selecting FFs to be replaced with scan FFs has been proposed which is capable of generating test input patterns of a partial-scan design circuit with a combinational test input pattern generation algorithm. It is reported that this proposed method can achieve a high fault coverage like the full-scan design (See T. Inoue et al., "An RT level Partial Scan Design Method Based on Combinational ATPG," TECHNICAL REPORT of IEICE, FTS96–67, February. 1997).

The scan design is a design for testability that replaces the existing FFs with scan FFs and connects them in the form of a shift register. In addition to the scan design, there is a test point insertion technique intended to improve the fault coverage of the circuits. More specifically, test points are inserted into signal lines having poor circuit controllability or observability (the circuit controllability is herein the degree of difficulty in setting "0" or "1" to signal lines within a circuit, and the observability is the degree of difficulty in observing the values of signal lines within a circuit) (see M. Nakao et al., "Accelerated Test Points Selection Method for Scan-Based BIST," IEEE 1997 Asian Test Symposium, pp. 359–364).

With the progress in semiconductor integration technology, integrated circuits have been increasingly miniaturized, causing a significant increase in the number of FFs included in the integrated circuit. In contrast, the number of external pins of the integrated circuit has been increased only slightly due to the structure of the integrated circuit. Therefore, in the current mainstream full-scan design, a significantly increased number of scan FFs are present in a single scan path, resulting in a significant increase in the number of test input patterns by a tester.

FIG. 41 schematically shows an example of the full-scan circuit. In FIG. 41, PI1, PI2 and PI3 denote external inputs,

2

PO1 and PO2 denote external outputs, FF1, FF2, FF3 and FF4 denote scan FFs, SI denotes scan-IN, and SO denotes scan-OUT. CK denotes a clock input, and SE denotes a scan-mode input for switching an operation of the respective scan FFs FF1 to FF4.

FIG. 42 shows a test input pattern generation model of the full-scan circuit of FIG. 41. In FIG. 42, normal data inputs of the scan FFs FF1 to FF4 are converted into pseudo external outputs PPO-FF1 to PPO-FF4, and outputs of the scan FFs FF1 to FF4 are converted into pseudo external inputs PPI-FF1 to PPI-FF4, respectively, so that the entire circuit is converted into a combinational circuit.

FIG. 43 shows test input patterns generated for the test input pattern generation model of FIG. 42. In FIG. 43, the external inputs are represented by "0" and "1", and expected values of the external outputs are represented by "H" and "L". The test input patterns for the test input pattern generation model as shown in FIG. 43 are herein referred to as "parallel test input patterns". In FIG. 43, two parallel test input patterns $V_1$ and $V_2$ are generated, and therefore the number of parallel test input patterns is "2".

An actually manufactured integrated circuit is a full-scan design circuit rather than the test input pattern generation model. Therefore, the parallel test input patterns as shown in FIG. 43 cannot directly be used for testing the integrated circuit with a tester. In other words, the parallel test input patterns generated for the test input pattern generation model must be converted into test input patterns of the actual full-scan design circuit.

FIG. 44 shows the parallel test input patterns of FIG. 43 converted into test input patterns for an actual full-scan design circuit. In FIG. 44, "–" indicates that no test input pattern is input, the rising edge of the clock CK indicates that a clock has been input, and "*" indicates that the expected values are not compared.

First, in order to set the values of the pseudo external inputs PPI-FF1 to PPI-FF4 of the first parallel test input pattern $V_1$, of FIG. 43 to the scans FFs FF1 to FF4 of FIG. 41, respectively, the circuit of FIG. 41 is rendered in a shift mode (SE=1), and the clock CK is input four times with "0", "1", "0" and "0" being sequentially set to the scan-IN SI. Thus, "1", "0", "1" and "0" are respectively set to the scan FFs FF1 to FF4.

Then, the circuit of FIG. 41 is rendered in a capture mode (SE=0), and the clock CK is input once, whereby the respective normal data input values are set to the scan FFs FF1 to FF4. In order to read these values from the scan-OUT SO, it is necessary to render the circuit of FIG. 41 again in the shift mode and to input values from the scan-IN SI.

Then, in order to set the values of the pseudo external inputs PPI-FF1 to PPI-FF4 of the second parallel test input pattern $V_2$ of FIG. 43 to the scans FFs FF1 to FF4, respectively, the circuit of FIG. 41 is rendered in the shift mode (SE=1), and the clock CK is input four times with "1", "0", "1" and "0" being sequentially set to the scan-IN SI. Thus, "0", "1", "0" and "1" are respectively set to the scan FFs FF1 to FF4, as well as the normal data input values that have been set to the respective scan FFs FF1 to FF4 in the capture mode are sequentially observed from the scan-OUT SO. In other words, this operation enables observation of the external outputs of the pattern $V_1$ as well as setting of the external outputs of the pattern $V_2$.

Thus, by inputting all parallel test input patterns while repeatedly executing the shift mode and the capture mode, the expected values are compared.

Accordingly, the number of test input patterns by the tester of the scan design circuit can be given by the following equation:

The number of test input patterns by the tester=(the number of parallel test input patterns+1)×the maximum number of scan FFs present in a single scan path+the number of parallel test input patterns.

As can be seen from the above equation, as the number of scan FFs present in a single scan path is significantly increased, the number of test input patterns by the tester is remarkably increased. This means that the test time of an actual integrated circuit is increased, causing increased costs of the integrated circuit.

Moreover, an increased circuit scale requires a decoder circuit and a combinational circuit using a number of input variables to be tested with a large number of test input patterns.

The number of test input patterns by the tester of the partial-scan design circuit is significantly affected by the scan rate. However, the partial-scan design circuit generally requires a larger number of parallel test input patterns than that of the full-scan circuit, and therefore the test time of the partial-scan design circuit is often longer than that of the full-scan design circuit.

SUMMARY OF THE INVENTION

It is an object of the present invention to enable reduction in test time of an actual integrated circuit as a method of design for testability.

More specifically, in a first aspect of the present invention, a method of design for testability for facilitating generation of test input patterns for an integrated circuit includes the step of allocating a design for testability on a block-by-block basis of the integrated circuit so as to reduce the number of test input patterns.

According to the first aspect, a design for testability is allocated to each block of the integrated circuit so as to reduce the number of test input patterns. Such a reduced number of test input patterns enables reduction in test time of an actual integrated circuit.

In the method of design for testability according to the first aspect of the invention, the step of allocating a design for testability preferably includes a first process of obtaining the number of parallel test input patterns of each block, assuming that each block is full-scan designed, a second process of full-scan designing a block of interest and inserting a test point therein, the block of interest being a block whose number of parallel test input patterns obtained in the first process exceeds a prescribed value, and a third process of full-scan designing a block other than the block of interest.

In the method of design for testability according to the first aspect of the invention, the step of allocating a design for testability preferably includes a first process of obtaining the number of parallel test input patterns of each block, assuming that each block is full-scan designed, a second process of full-scan designing a block of interest, the block of interest being a block having a largest number of parallel test input patterns obtained in the first process, and a third process of partial-scan designing or full-scan designing a block other than the block of interest so that the number of parallel test input patterns of the block does not exceed the number of parallel test input patterns of the block of interest that is obtained in the first process.

In the method of design for testability according to the first aspect of the invention, the step of allocating a design for testability preferably includes a first process of obtaining the number of parallel test input patterns of each block, assuming that each block is full-scan designed, a second process of full-scan designing a block of interest and inserting a test point therein, the block of interest being a block whose number of parallel test input patterns obtained in the first process exceeds a prescribed value, a third process of obtaining the number of parallel test input patterns of the block of interest, and a fourth process of partial-scan designing or full-scan designing a block other than the block of interest so that the number of parallel test input patterns of the block does not exceed the number of parallel test input patterns of the block of interest that is obtained in the third process.

In the method of design for testability according to the first aspect of the invention, the step of allocating a design for testability preferably includes a process of selecting a design for testability for each block from a respective design-for-testability library according to an evaluation function of test time required for fault testing, each of the respective design-for-testability libraries of the blocks storing types of designs for testability and result information indicating results of the designs for testability.

Each of the design-for-testability libraries preferably stores as the result information the number of scan FFs (flip-flops) and the number of parallel test input patterns.

The evaluation function is preferably a product of a sum of the respective numbers of scan FFs of the blocks and a maximum value of the number of parallel test input patterns of the blocks.

In a second aspect of the present invention, a method of design for testability for facilitating generation of test input patterns for a partially scanned integrated circuit includes: a first process of finding, for each input of a plurality of blocks, which is connected in common to an output of a same block in the integrated circuit, an FF that is accessible from the input only through a combinational circuit and is not a scan FF, as well as calculating the number of such FFs for each input; a second process of selecting from the inputs connected to the output of the same block an input having a largest number of FFs obtained in the first process; and a third process of replacing every FF found in the first process with a scan FF, the third process being conducted for each of the inputs other than that selected in the second process.

In a third aspect of the present invention, a method of design for testability for facilitating generation of test input patterns for an integrated circuit includes the step of, when the integrated circuit is a combinational circuit or a full-scan design circuit, or when a block forming the integrated circuit is a combinational circuit or a full-scan design circuit, determining a test-point position so as to reduce the number of parallel test input patterns of the integrated circuit or the block, wherein a test circuit is inserted at the test-point position determined in the step.

In the method of design for testability according to the third aspect of the invention, the step of determining a test-point position preferably includes a first process of, when a plurality of selected external outputs have a common accessible external input, determining the test-point position so as to make only one of the plurality of external outputs accessible to the external input.

In the method of design for testability according to the third aspect of the invention, the step of determining a test-point position preferably includes a first process of, when the number of external inputs accessible from a selected external output is equal to or larger than a prescribed value, determining the test-point position so as to make the number of accessible external inputs smaller than the prescribed value.

The step of determining a test-point position preferably includes as a pre-process a process of calculating a fault coverage of each external output of the integrated circuit or the block, wherein the external output(s) of the first process is preferably selected based on the calculated fault coverage.

The step of determining a test-point position preferably includes as a pre-process a process of calculating the number of external inputs accessible from each external output of the integrated circuit or the block, wherein the external output(s) of the first process is preferably selected based on the calculated number of accessible external inputs.

In the method of design for testability according to the third aspect of the invention, the step of determining a test-point position preferably determines the test-point position so as to make a maximum value of a value-assignment probability of an external input smaller than a prescribed value.

In the method of design for testability according to the third aspect of the invention, the step of determining a test-point position preferably includes a first process of calculating a fault coverage of each external output of the integrated circuit or the block, and a second process of calculating as a value-assignment probability of each external input, a sum of the respective fault coverage of the external outputs accessible from the external input which are calculated in the first process, wherein the test-point position is preferably determined so that a value-assignment probability of each external input becomes lower than a prescribed value when a signal line having a test point inserted therein is regarded as an external input/output (I/O).

Preferably, a position that results in a smallest maximum value of the value-assignment probability of the external input upon tentative insertion of the test point is preferentially determined as the test-point position.

The step of determining a test-point position preferably includes a first process of calculating a fault coverage of each external output and a value-assignment probability of each signal line, a second process of selecting candidate signal lines for test-point insertion from representative signal lines, based on the calculation result of the first process, and a third process of selecting a signal line for test-point insertion from the candidate signal lines selected in the second process.

The representative signal lines are preferably fan-out stems.

Preferably, the representative signal lines are fan-out stems and have a value-assignment probability higher than a maximum value of the fault coverage of the external output as well as lower than a maximum value of the value-assignment probability of the external input.

Preferably, the second process is a process of calculating a cost of each representative signal line and preferentially selecting representative signal lines having a larger cost value as the candidate signal lines, wherein the cost is calculated by the steps of obtaining a set of external outputs accessible to the representative signal line, obtaining, for each external output of the set, a sum of differences between a prescribed threshold value of the value-assignment probability and the respective value-assignment probabilities of the external inputs that are accessible from the external output and have a value-assignment probability equal to or higher than the threshold value, and calculating as a cost value a sum of the respective sums of the external outputs of the set.

Preferably, the third process is a process of calculating a cost of each candidate signal line and preferentially selecting a candidate signal line having a larger cost value as the signal line for test-point insertion, wherein the cost is calculated by the steps of obtaining a set of external inputs accessible to the candidate signal line and having a value-assignment probability equal to or higher than a prescribed threshold value, obtaining a reduction amount for each external input of the set, the reduction amount being a sum of the respective fault coverage of the external outputs that become no longer accessible from the external input upon disconnecting the candidate signal line, and calculating as a cost value a sum of the respective reduction amounts of the external inputs of the set.

In a design-for-testability integrated circuit according to a fourth aspect of the present invention, a test circuit formed from a scan FF and a two-input selector is inserted in a signal line, the integrated circuit including a scan FF for controlling a selection signal line of the two-input selector.

In the design-for-testability integrated circuit, the scan FF is preferably formed so that its data input is fixed to a value of a selection signal for a normal operation of the two-input selector and a reset value of the scan FF at its reset input is disenabled during scan testing.

In the design-for-testability integrated circuit, the scan FF preferably has its data input fixed to a value of a selection signal for a normal operation of the two-input selector.

In the design-for-testability integrated circuit, the scan FF is preferably formed so that its data input is connected to a signal line and a reset value of the scan FF at its reset input is disenabled during scan testing.

A design method for an integrated circuit according to a fifth aspect of the present invention includes the step of selecting a design for testability for each block of the integrated circuit from a respective design-for-testability library, each of the respective design-for-testability libraries of the blocks storing types of designs for testability and result information indicating results of the designs for testability.

BRIEF DESCRIPTION OF THE DRAWINGS

FIG. 3 is a flowchart illustrating a process flow of a method of design for testability according to a second embodiment of the present invention.

FIGS. 4A to 4C are diagrams showing the results of steps S26 and S27 of the flow of FIG. 3 for blocks A, B and D of FIG. 2A, respectively.

FIGS. 6A to 6C are diagrams showing the results of steps S36 and S37 of the flow of FIG. 5 for the blocks A, B and D of FIG. 2A, respectively.

FIG. 27A is a diagram showing a fault coverage of each external output in the circuit of FIG. 26B.

FIG. 27B is a diagram showing a value-assignment probability of each external input in the circuit of FIG. 26B.

FIG. 28 is a flowchart illustrating a process flow of a method of design for testability according to a ninth embodiment of the present invention.

FIG. 32A is a diagram showing a fault coverage of each external output in the circuit of FIG. 31.

FIG. 32B is a diagram showing a value-assignment probability of each external input in the circuit of FIG. 31.

FIG. 33 is a diagram showing the cost calculation result of each representative signal line in the circuit of FIG. 31.

FIG. 34 is a diagram showing the cost calculation result of each candidate signal line for test-point insertion in the circuit of FIG. 31.

FIG. 36A is a diagram showing a fault coverage of each external output in the circuit of FIG. 35.

FIG. 36B is a diagram showing a value-assignment probability of each external input in the circuit of FIG. 35.

FIG. 37 is a diagram showing the cost calculation result of each representative signal line in the circuit of FIG. 35.

FIG. 38 is a diagram showing the cost calculation result of each candidate signal line for test-point insertion in the circuit of FIG. 35.

FIG. 40A is a diagram showing a fault coverage of each external output in the circuit of FIG. 39.

FIG. 40B is a diagram showing a value-assignment probability of each external input in the circuit of FIG. 39.

FIG. 43 is a diagram showing test input patterns generated for the test input pattern generation model of FIG. 42.

FIG. 44 is a diagram showing the parallel test input patterns of FIG. 43 converted into test input patterns for an actual full-scan design circuit.

DETAILED DESCRIPTION OF THE INVENTION

Hereinafter, embodiments of the present invention will be described with reference to the accompanying drawings.
(First Embodiment)

Figure 1:
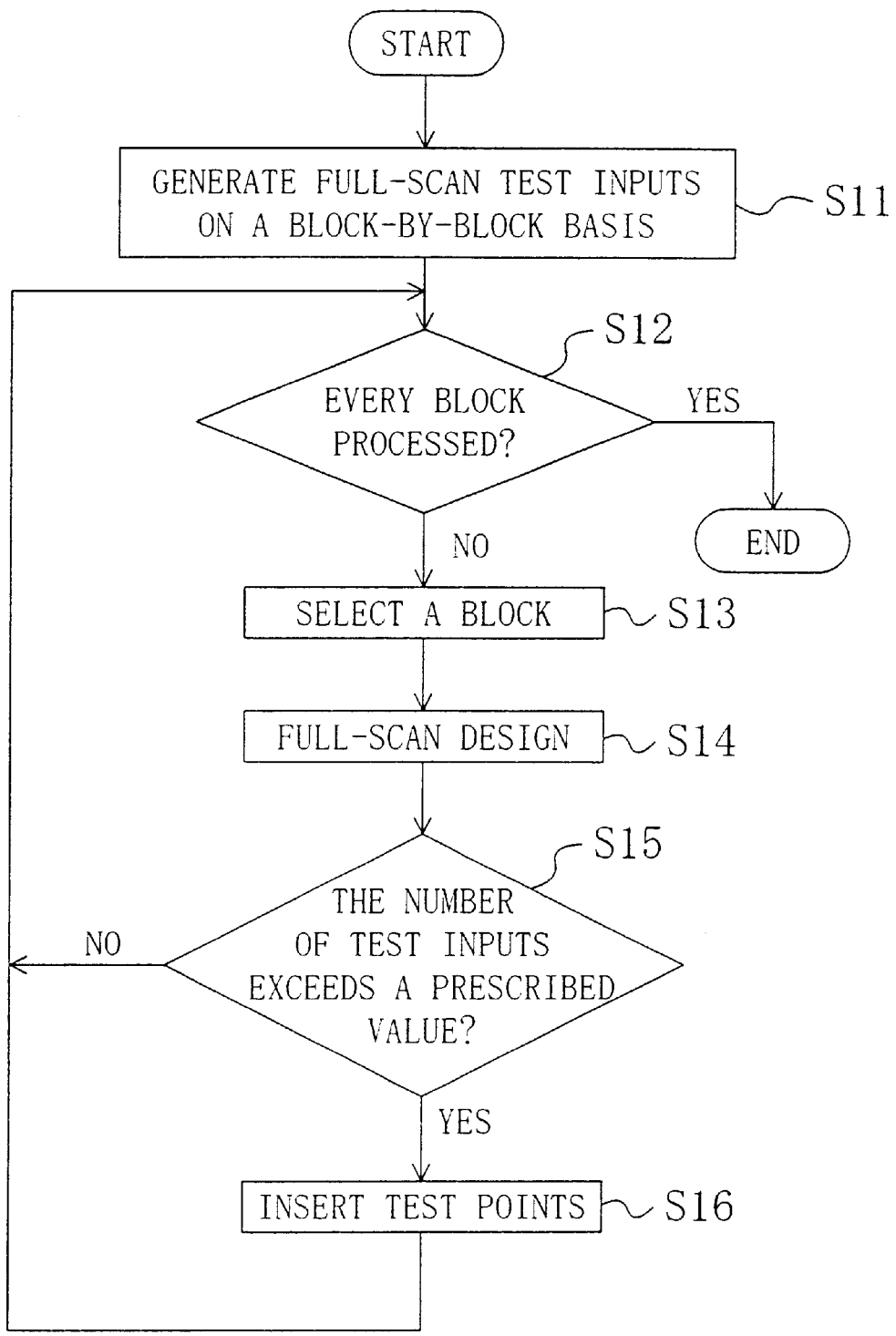
FIG. 1 is a flowchart illustrating a process flow of a method of design for testability according to a first embodiment of the present invention.

FIG. 1 is a flowchart illustrating a process flow of a method of design for testability according to a first embodiment of the present invention. In step S11, an integrated circuit is full-scan designed on a block-by-block basis, so that test input patterns are generated for the resultant full-scan design circuits, as well as a required number of parallel test input patterns of each block is calculated. In step S12, it is determined whether or not every block has been subjected to the following steps S13 to S16. If YES in step S12, the process is terminated. Otherwise, the process proceeds to step S13.

In step S13, one of the blocks to which the design for testability has not been allocated is selected, and in step S14, full-scan design is allocated to the block selected in step S13. In step S15, it is determined whether or not the number of parallel test input patterns of the block selected in step S13 exceeds a prescribed value when that block is full-scan designed. If YES in step S15, the process proceeds to step S16. Otherwise, the process returns to step S12. In step S16, test points are inserted into the full-scan circuit of the block selected in step S13, and the number of parallel test input patterns is calculated for the resultant full-scan circuit having the test points inserted therein.

Based on the flowchart of FIG. 1, a method of design for testability according to the present embodiment will now be described in terms of a specific circuit with reference to FIGS. 2A to 2C.

Figures 2A, 2B, 2C:
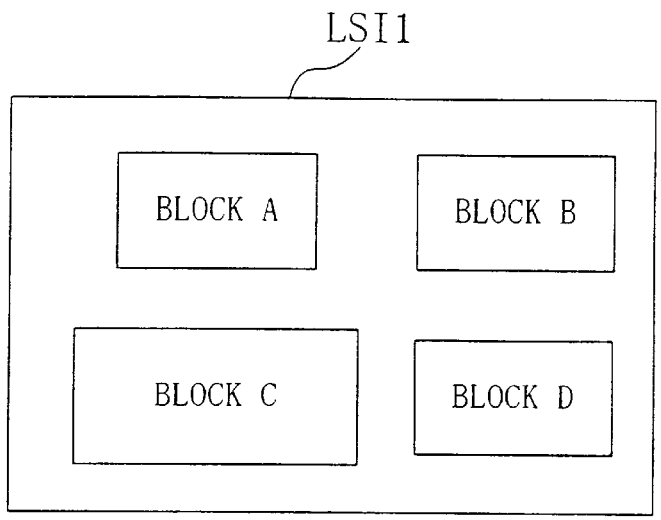
FIG. 2A is a diagram showing an exemplary integrated circuit to which a design for testability is to be applied.
FIG. 2B is a diagram showing the number of scan FFs (flip-flops) and the number of test input patterns of each block shown in FIG. 2A when the block is full-scan designed.
FIG. 2C is a diagram showing the number of scan FFS and the number of test input patterns of a block C having test points inserted therein.

FIG. 2A shows an exemplary integrated circuit to be subjected to the method of the present embodiment. In FIG. 2A, an integrated circuit (LSI) 1 is formed from a plurality of blocks A, B, C and D. Each block A, B, C, D may either be a core or IP.

First, in step S11, each block A, B, C, D of the integrated circuit 1 is full-scan designed, and test input patterns are generated for the resultant full-scan design circuits. FIG. 2B shows the number of scan FFs (flip-flops) and the number of test input patterns of each of the full-scan designed blocks. It is herein assumed that the fault coverage of each block is high enough, and the number of scan paths is four.

Then, in steps S12 to S16, design for testability is allocated to each block A, B, C, D. It is herein assumed that the prescribed value of step S15 is 1,500. This prescribed value is set based on the upper limit of the number of test input patterns by the tester used for fault testing of an actual integrated circuit. For example, provided that the upper limit of the number of test input patterns by the tester is 15M (mega) patterns, the average number of FFs per scan path is 10,000 in view of the number of scan paths (4) and the number of scan FFs (40,000). Therefore, the number of parallel test input patterns must be 1,500 or less.

Provided that the prescribed value of step S15 is 1,500 and test points are inserted into a block having more than 1,500 parallel test input patterns in step S16, only the block C having more than 1,500 parallel test input patterns (i.e., 2,000) is subjected to the test-point insertion.

In step S16, test points are inserted into the full-scan designed block C, and test input patterns are generated for the resultant full-scan design circuit having the test point inserted therein. It is herein assumed that, when 160 test points (this number corresponds to the increased number of scan FFs) are inserted, the resultant number of parallel test input patterns is 1,200, as shown in FIG. 2C.

The effects of the present embodiment will now be described in comparison with a conventional example.

In the conventional-full scan design, the number of parallel test input patterns of the integrated circuit is governed by the maximum number of parallel test input patterns of the blocks. Therefore, the number of test input patterns by the tester can be approximately given by the maximum number of parallel test input patterns of the blocks×the total number of scan FFs/the number of scan paths. In other words, the number of test input patterns by the tester can be estimated as follows:

$$2,000 \times 40,000/4 = 20 \text{ M patterns.}$$

On the other hand, in the present embodiment, the maximum number of parallel test input patterns of the blocks was reduced from 2,000 to 1,200 as a result of insertion of 160 test points into the block C. Therefore, the number of test input patterns by the tester can be estimated as follows:

$$1,200 \times 40,160/4 = \text{about 12M patterns.}$$

Thus, the present embodiment enables significant reduction in the number of test input patterns by the tester, i.e., the test time.

(Second Embodiment)

FIG. 3 is a flowchart illustrating a process flow of a method of design for testability according to a second embodiment of the present invention. In step S21, an integrated circuit is full-scan designed on a block-by-block basis, so that test input patterns are generated for the resultant full-scan design circuits, as well as a required number of parallel test input patterns of each block is calculated. In step S22, it is determined whether or not every block has been subjected to the following steps S23 to S27. If YES in step S22, the process is terminated. Otherwise, the process proceeds to step S23.

In step S23, one of the blocks to which the design for testability has not been allocated is selected, and in step S24, it is determined whether or not the block selected in step S23 has the largest number of parallel test input patterns among all blocks when full-scan designed. If YES in step S24, the process proceeds to step S25, where the full-scan design is conducted. Then, the process returns to step S22. If NO in step S24, the process proceeds to step S26.

In step S26, the block selected in step S23 is partial-scan designed, and the number of parallel test input patterns is calculated for the resultant partial-scan design circuit. It is herein assumed that the fault coverage is high enough. A circuit that cannot be partial-scan designed due to the circuit structure would be full-scan designed.

In step S27, it is determined whether or not the number of parallel test input patterns of the partial-scan design circuit resulting from step S26 exceeds the maximum number of parallel test input patterns of the full-scan designed blocks as calculated in step S21. If NO in step S27, the process returns to step S22. Otherwise, the process returns to step S26. In step S26, in order to reduce the number of parallel test input patterns, the number of scan FFs is increased so as to reduce the maximum sequence depth in the partial-scan design circuit. Detection of a single stuck-at fault requires the following number of parallel test input patterns or less: (the maximum sequence depth of the circuit (the maximum number of FFs present in the path from the external input to the external output)+1). By reducing the maximum sequence depth of the circuit, the number of parallel test input patterns can be reduced.

Based on the flowchart of FIG. 3, a method of design for testability according to the present embodiment will now be described in terms of a specific circuit with reference to FIGS. 2A to 2C and 4A to 4C.

First, in step S21, each block A, B, C, D of the integrated circuit 1 of FIG. 2A is full-scan designed, and test input patterns are generated for the resultant full-scan design circuits. It is herein assumed that the number of scan FFs and the number of test input patterns of each block are as shown in FIG. 2B, and that the fault coverage of each block is high enough.

Then, in steps S22 to S27, design for testability is allocated to each block A, B, C, D. In step S24, the block C has the largest number of parallel test input patterns when full-scan designed. Therefore, full-scan design is allocated to the block C in step S25. Since the other blocks A, B and D do not have the largest number of parallel test input patterns when full-scan designed, steps S26 and S27 are conducted for design for testability allocation.

FIGS. 4A to 4C show the results of steps S26 and S27 for the blocks A, B and D, respectively.

As shown in FIG. 4A, in the case where the block A was partial-scan designed with its 1,000 FFs replaced with scan FFs, the number of parallel test input patterns was 3,000 (step S26). Since this number of parallel test input patterns exceeds that of the full-scan designed block C (2,000) (YES in step S27), the number of scan FFs was increased. The block A had 1,500 parallel test input patterns with 3,000 scan FFs (step S26). Since the number of parallel test input patterns (1,500) no longer exceeds that of the full-scan designed block C (2,000), the block A with 3,000 scan FFs is determined as its partial-scan design.

As shown in FIG. 4B, in the case where the block B was partial-scan designed with its 3,000 FFs replaced with scan FFs, the number of parallel test input patterns was 700 (step S26). Since this number of parallel test input patterns does not exceed that of the full-scan designed block C (2,000) (NO in step S27), the block B with 3,000 scan FFs is determined as its partial-scan design.

As shown in FIG. 4C, in the case where the block D was partial-scan designed with its 5,000 FFs replaced with scan FFs, the number of parallel test input patterns was 7,000. With its 8,000 FFs replaced with scan FFs, the number of parallel test input patterns was 5,000. With its 10,000 FFs replaced with scan FFs, the number of parallel test input patterns was 3,000 (step S26). In each case, the number of parallel test input patterns exceeds that of the full-scan designed block C (2,000) (YES in step S27). Therefore, the number of scan FFs must be increased. Finally, with 12,000 FFs in the block D replaced with scan FFs, the number of parallel test input patterns was 1,800 (step S26), which no longer exceeds that of the full-scan designed block C (2,000) (NO in step S27). Therefore, the block D with 12,000 scan FFs is determined as its partial-scan design.

As described in the first embodiment, the number of test input patterns by the tester in the conventional full-scan design can be estimated as follows:

2,000×40,000/4=20M patterns.

In contrast, in the present embodiment, full-scan design was allocated to the block C, i.e., the block having the largest number of parallel test input patterns when full-scan designed, and partial-scan design was allocated to the other blocks A, B and D, whereby the total number of scan FFs in the integrated circuit 1 was reduced from 40,000 to 26,000 (=3,000+3,000+8,000+12,000 ). Therefore, the number of test input patterns by the tester can be estimated as follows:

2,000×26,000/4=about 13M patterns.

Thus, the present embodiment enables significant reduction in the number of test input patterns by the tester, i.e., the test time.

(Third Embodiment)

Figure 5:
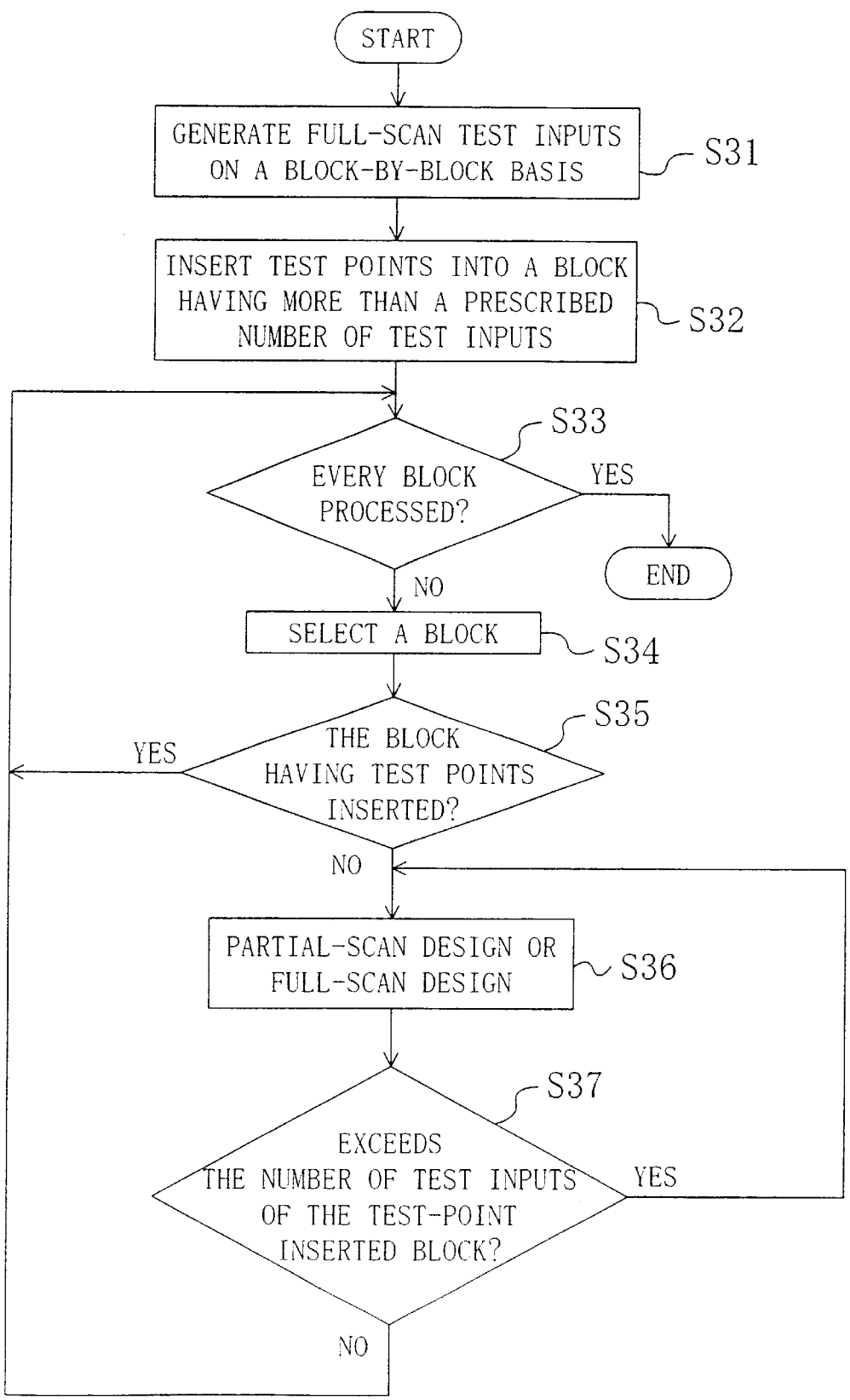
FIG. 5 is a flowchart illustrating a process flow of a method of design for testability according to a third embodiment of the present invention.

FIG. 5 is a flowchart illustrating a process flow of a method of design for testability according to a third embodiment of the present invention. In step S31, an integrated circuit is full-scan designed on a block-by-block basis, so that test input patterns are generated for the resultant full-scan design circuits, as well as a required number of parallel test input patterns of each block is calculated. In step S32, test points are inserted into a block having more than a prescribed number of parallel test input patterns. Steps S31 and S32 correspond to the method according to the first embodiment. In step S33, it is determined whether or not every block has been subjected to the following steps S34 to S37. If YES in step S33, the process is terminated. Otherwise, the process proceeds to step S34.

In step S34, one of the blocks to which the design for testability has not been allocated is selected, and in step S35, it is determined whether or not the block selected in step S34 is that having the test points inserted therein in step S32. If YES in step S35, the process returns to step S33. Otherwise, the process proceeds to step S36.

In step S36, the block selected in step S34 is partial-scan designed, and the number of parallel test input patterns is calculated for the resultant partial-scan design circuit. It is herein assumed that the fault coverage is high enough. A circuit that cannot be partial-scan designed due to the circuit structure would be full-scan designed.

In step S37, it is determined whether or not the number of parallel test input patterns of the partial-scan design circuit resulting from step S36 exceeds the maximum number of parallel test input patterns of the block having the test points inserted therein in step S32. If NO in step S37, the process returns to step S33. Otherwise, the process returns to step S36. In step S36, in order to reduce the number of parallel test input patterns, the number of scan FFs is increased so as to reduce the maximum sequence depth in the partial-scan design circuit. As described in the second embodiment, detection of a single stuck-at fault requires the following number of parallel test input patterns or less: (the maximum sequence depth of the circuit (the maximum number of FFs present in the path from the external input to the external output)+1). By reducing the maximum sequence depth of the circuit, the number of parallel test input patterns can be reduced.

Based on the flowchart of FIG. 5, a method of design for testability according to the present embodiment will now be described in terms of a specific circuit with reference to FIGS. 2A to 2C and 6A to 6C.

First, in step S31, each block A, B, C, D of the integrated circuit 1 of FIG. 2A is full-scan designed, and test input patterns are generated for the resultant full-scan design circuits. It is herein assumed that the number of scan FFS and the number of test input patterns of each block are as shown in FIG. 2B, and that the fault coverage of each block is high enough.

Then, in step S32, assuming that the prescribed value is 1,500, test points are inserted into a block having more than 1,500 parallel test input patterns. As shown in FIG. 2C, 160 test points are inserted into the block C having more than 1,500 parallel test input patterns (2,000). It is herein assumed that the number of parallel test input patterns for the full-scan design circuit is 1,200 after the test-point insertion.

Thereafter, in steps S33 to S37, design for testability is allocated to each block A, B, C, D. Since the test points have already been inserted into the block C in step S32, it is determined in step S35 that full-scan design with test-point insertion has been allocated to the block C. Since no test point has been inserted into the other blocks A, B and D, steps S36 and S37 are conducted for design for testability allocation.

FIGS. 6A to 6C show the results of steps S36 and S37 for the blocks A, B and D, respectively.

As shown in FIG. 6A, in the case where the block A was partial-scan designed with its 1,000 FFs replaced with scan FFS, the number of parallel test input patterns was 3,000 (step S36). With its 3,000 FFS replaced with scan FFs, the number of parallel test input patterns was 1,500. With its 4,000 FFs replaced with scan FFs, the number of parallel test input patterns was 1,300. In each case, the number of parallel test input patterns exceeds that of the full-scan designed block C having the test points inserted therein (1,200) (YES in step S37). Therefore, the process returns to step S36 so as to increase the number of scan FFs. Finally, the block A was partial-scan designed with its 5,000 FFs replaced with scan FFs. In this case, the number of parallel test input patterns was 1,100, which no longer exceeds 1,200 (NO in step S37). Therefore, the block A with 5,000 scan FFs is determined as its partial-scan design.

As shown in FIG. 6B, in the case where the block B was partial-scan designed with its 3,000 FFs replaced with scan FFs, the number of parallel test input patterns was 700 (step S36). Since this number of parallel test input patterns does not exceed that of the full-scan designed block C having the test points inserted therein (1,200) (NO in step S37), the block B with 3,000 scan FFs is determined as its partial-scan design.

As shown in FIG. 6C, in the case where the block D was partial-scan designed with its 5,000 FFs replaced with scan FFs, the number of parallel test input patterns was 7,000. With its 8,000 FFs replaced with scan FFs, the number of parallel test input patterns was 5,000. With its 10,000 FFs replaced with scan FFs, the number of parallel test input patterns was 3,000. With its 12,000 FFs replaced with scan FFs, the number of parallel test input patterns was 1,800 (step S36). In each case, the number of parallel test input patterns exceeds that of the full-scan designed block C having the test points inserted therein (1,200) (YES in step S37). Therefore, the number of scan FFs must further be increased. Finally, 13,000 FFs of the block D were replaced with scan FFs. In this case, the number of parallel test input patterns was 1,150 (step S36), which no longer exceeds the number of parallel test input patterns (1,200) of the full-scan designed block C having the test points inserted therein (NO in step S37). Therefore, the block D with 13,000 scan FFs is determined as its partial-scan design.

As described in the first embodiment, the number of test input patterns by the tester in the conventional full-scan design can be estimated as follows:

2,000×40,000/4=20M patterns.

In contrast, in the present embodiment, 160 test points were inserted into the block C, whereby the number of parallel test input patterns thereof was reduced from 2,000 to 1,200. Moreover, partial-scan design was allocated to the other blocks A, B and D, whereby the total number of scan FFs in the integrated circuit 1 was reduced from 40,000 to 29,160 (=5,000+3,000+8,160+13,000). Therefore, the number of test input patterns by the tester can be estimated as follows:

1,200×29,160/4=about 8.7M patterns.

Thus, the present embodiment enables further significant reduction in the number of test input patterns by the tester, i.e., the test time.

(Fourth Embodiment)

A method of design for testability according to the fourth embodiment of the present invention is a method for selecting a design for testability of each block from the respective design-for-testability library according to an evaluation function of the test time required for fault testing, and allocating the selected designs for testability to the respective blocks. In the present embodiment, it is assumed that the design-for-testability libraries store the types of designs for testability and the result information indicating the results of the designs for testability, i.e., the number of scan FFS and the number of parallel test input patterns.

Figure 7:
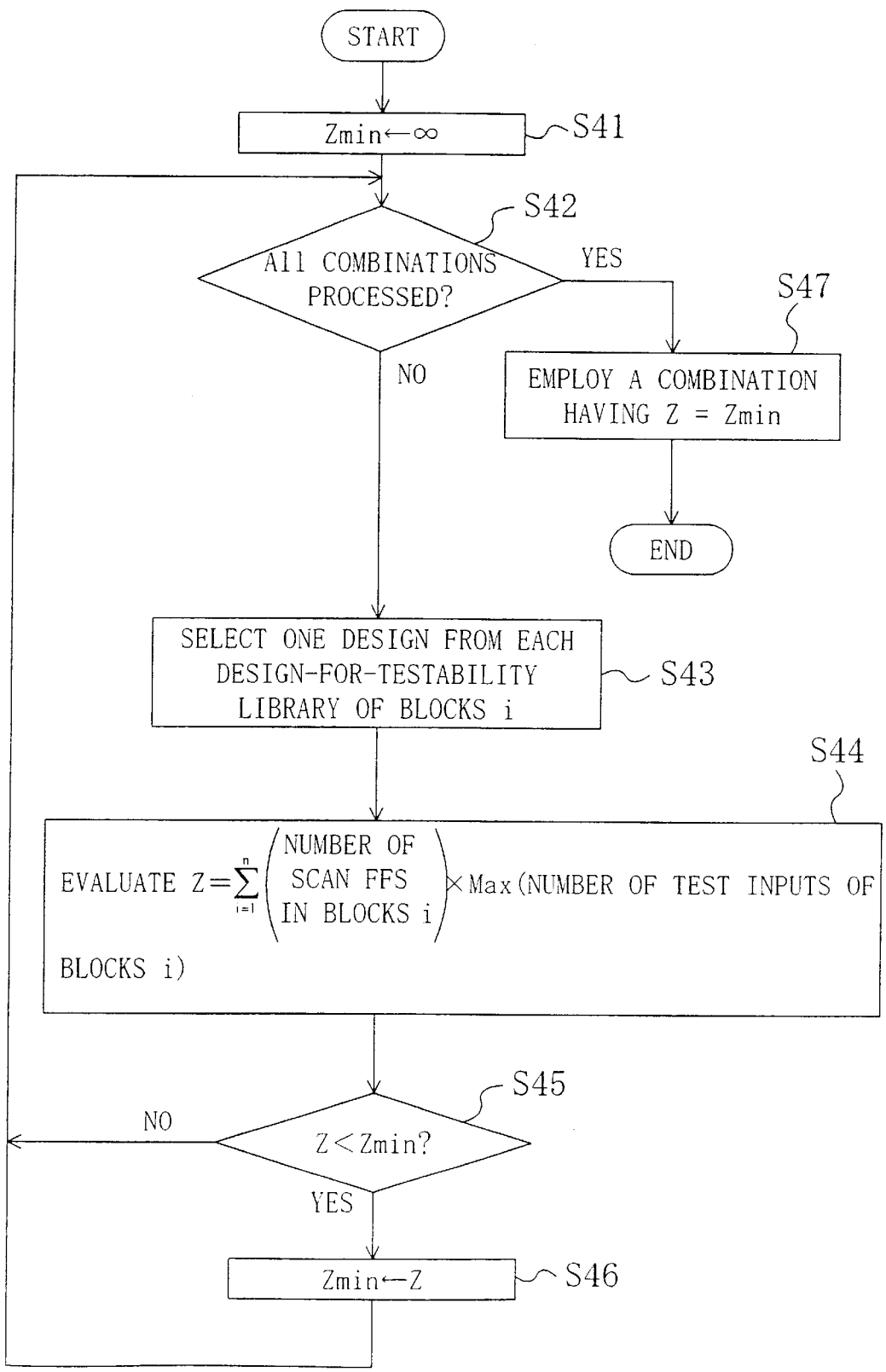
FIG. 7 is a flowchart illustrating a process flow of a method of design for testability according to a fourth embodiment of the present invention.
Figure 8:
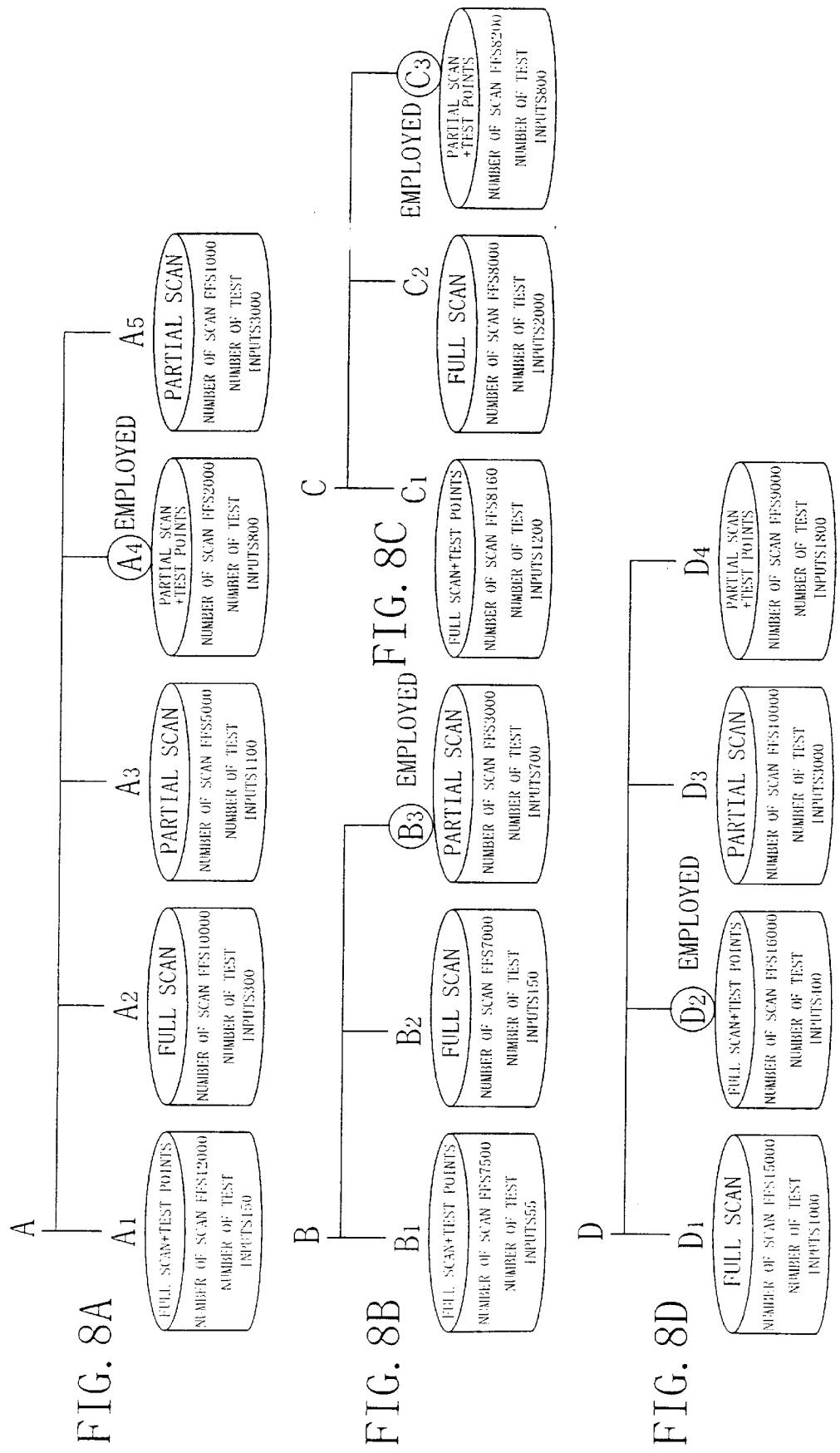
FIGS. 8A to 8D are diagrams showing respective design-for-testability libraries of the blocks of FIG. 2A.

FIG. 7 is a flowchart illustrating a process flow in the method of design for testability according to the present embodiment. In step S41, the minimum value Zmin of the evaluation function of the test time required for fault testing is initialized to ∞. In step S42, it is determined whether or not all combinations of the types of designs for testability of each block stored in the design-for-testability libraries have been subjected to the following steps S43 to S46. If the process has been completed for all combinations, the process proceeds to step S47, where the combination having the evaluation function Z equal to Zmin is employed, and the process is then terminated. Otherwise, the process proceeds to step S43.

In step S43, a single design for testability is selected for each block from the respective design-for-testability libraries. The combination of designs for testability selected in step S43 has not been evaluated in steps S44 to S46. In step S44, the evaluation function value Z is calculated. In step S45, it is determined whether or not the evaluation function value Z is smaller than the minimum value Zmin. If the evaluation function value Z is smaller than the minimum value Zmin, the process proceeds to step S46, where the value Z is substituted for Zmin, and the process then returns to step S42. Otherwise, the process directly returns to step S42.

It is herein assumed that the evaluation function is a product of the sum of the respective numbers of scan FFs of the blocks and the maximum value of the number of parallel test input patterns of the blocks.

FIGS. 8A to 8D show an example of the design-for-testability libraries according to the present embodiment. FIGS. 8A to 8D respectively show the design-for-testability libraries of the blocks A, B, C and D of the integrated circuit 1 shown in FIG. 2A.

When the method of design for testability of the present embodiment is conducted according to the flowchart of FIG. 7, a combination having the smallest evaluation function value Z among the combinations of designs for testability selected from the design-for-testability libraries of FIGS. 8A to 8D is A4, B3, C3, D2. In this case, the evaluation function value Z is 23360,000.

As described in the first embodiment, the number of test input patterns by the tester in the conventional full-scan design can be estimated as follows:

2,000×40,000/4=20M patterns.

In contrast, in the present embodiment, the combination of designs for testability having the smallest evaluation function value of the test time (A4, B3, C3, D2) was selected from the design-for-testability libraries, whereby the maximum number of parallel test input patterns was reduced from 2,000 to 800. Moreover, the total number of scan FFs in the integrated circuit 1 was reduced from 40,000 to 29,200 (=2,000+3,000+8,200+16,000). Therefore, the number of test input patterns by the tester can be estimated as follows:

800×29,200/4=about 5.8M patterns.

Thus, the present embodiment enables further significant reduction in the number of test input patterns by the tester, i.e., the test time.

Moreover, registering the testability information in the design-for-testability libraries in advance can reduce the design for testability time and the test input pattern generation time, and can also avoid the process for obtaining the information, enabling reduction in the design period of the integrated circuit. More specifically, the design-for-testability libraries as shown in FIGS. 8A to 8D are used to select and allocate the designs for testability to the respective blocks, whereby reduction in the design period is implemented. This will be particularly effective in designing an IP-based integrated circuit.

(Fifth Embodiment)

Figure 9:
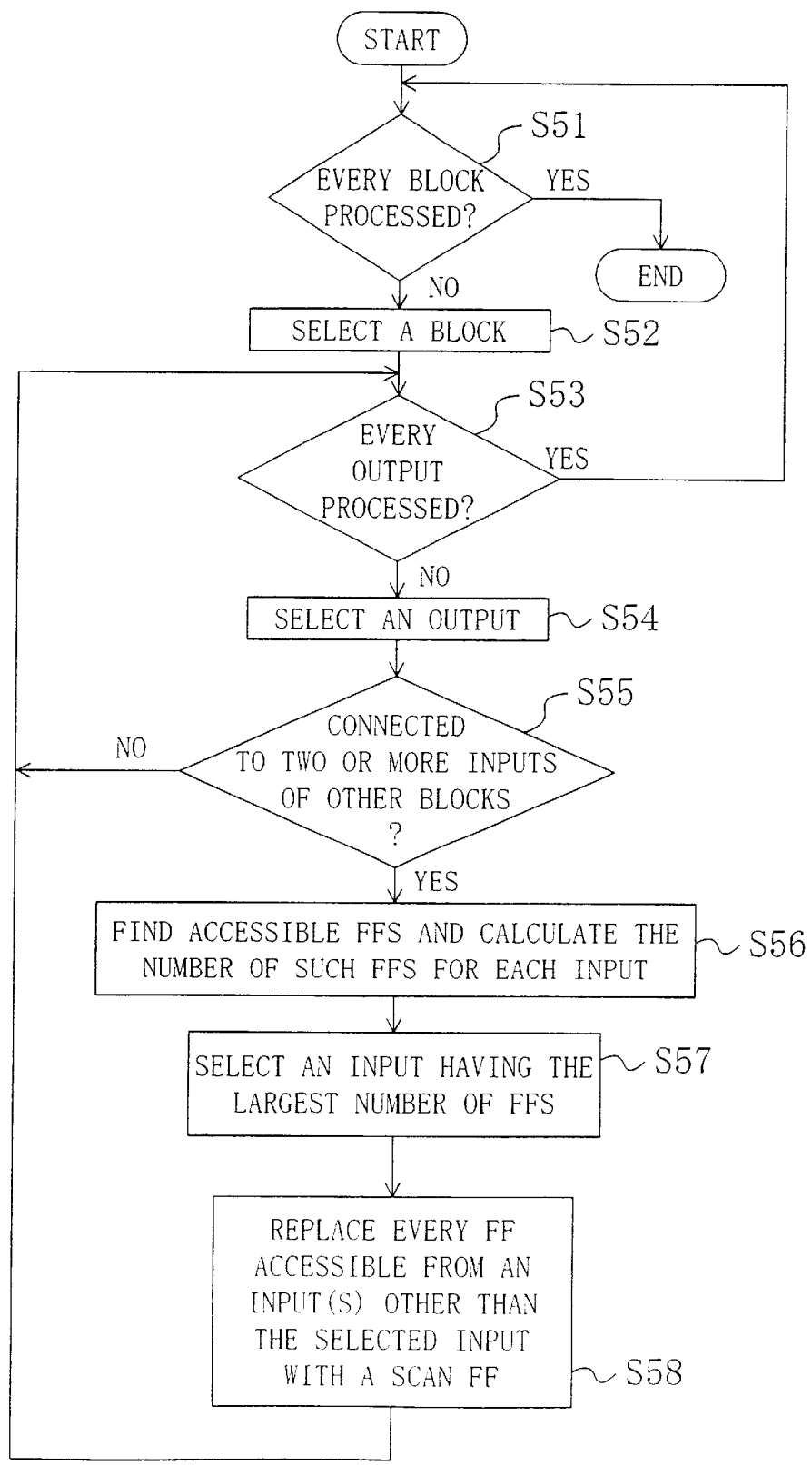
FIG. 9 is a flowchart illustrating a process flow of a method of design for testability according to a fifth embodiment of the present invention.

FIG. 9 is a flowchart illustrating a process flow in a method of design for testability according to the fifth embodiment of the present invention. In step S51, it is determined whether or not every block of the partial-scan designed integrated circuit has been subjected to the following steps S52 to S58. If YES in step S51, the process is terminated. Otherwise, the process proceeds to step S52. In step S52, one of the blocks that have not been processed is selected.

In step S53, it is determined whether or not every output of the block selected in step S52 has been subjected to the following steps S54 to S58. If YES in step S53, the process returns to step S51. Otherwise, the process proceeds to step S54. In step S54, one of the outputs that have not been processed is selected.

In step S55, it is determined whether or not the output selected in step S54 is connected to at least two inputs of the blocks. If NO in step S55, the process returns to step S53. If YES, the process proceeds to step S56, where an FF(s) that is accessible to the output only through a combinational circuit and is not a scan FF is found as well as the number of such FFs is calculated for each of such inputs. Then, an input having the largest number of such FFs is selected (step S57), and every FF accessible from the input(s) other than the selected one is replaced with a scan FF.

Figure 10:
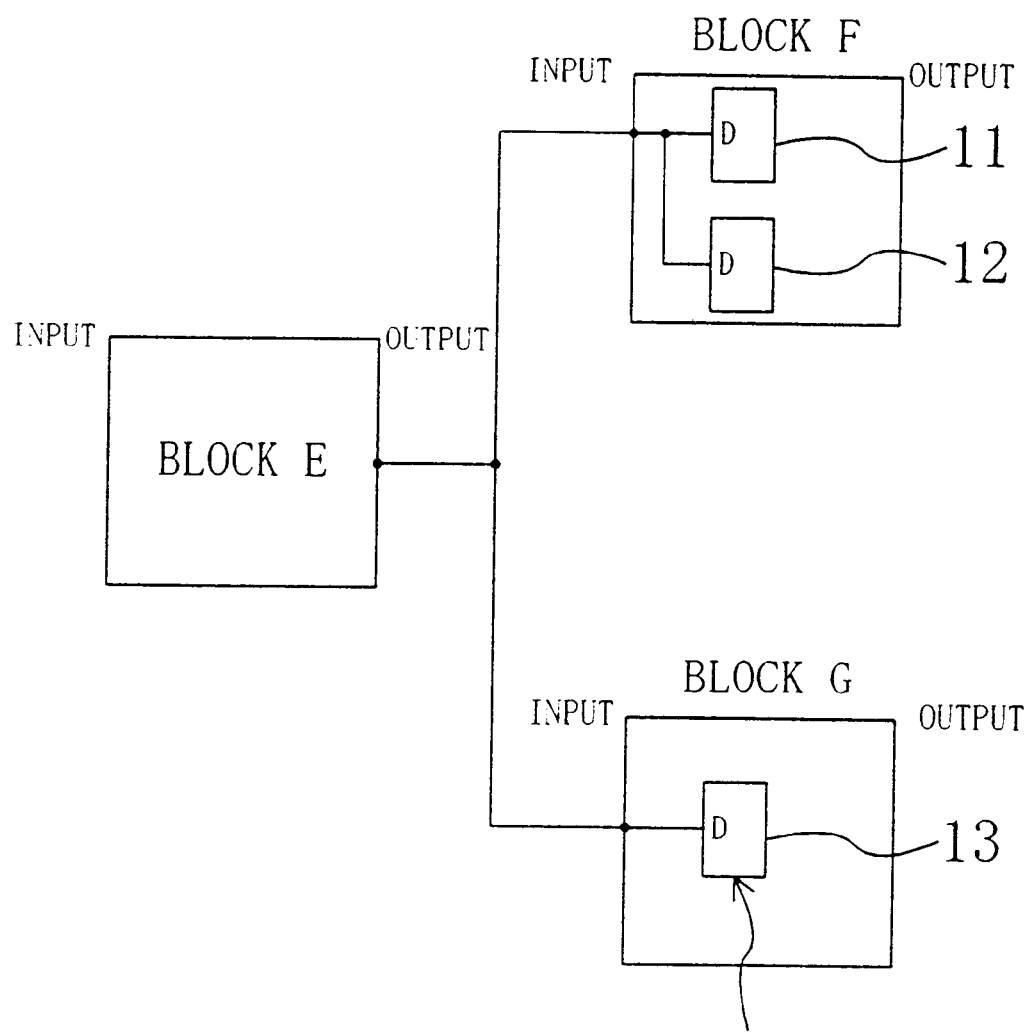
FIG. 10 is a diagram showing the connection between blocks to be subjected to the process of FIG. 9.

The method of design for testability according to the present embodiment will now be described with reference to FIG. 10. In FIG. 10, E, F and G denote the blocks in the integrated circuit, and 11, 12 and 13 denote FFs.

As described in the first to fourth embodiments, it can be considered that the number of parallel test input patterns of the integrated circuit is governed by the maximum number of parallel test input patterns of the blocks. This must be considered on the assumption that, when partial-scan design is allocated as design for testability of the block, any FF within the block, which is accessible from the output of the block only through a combinational circuit portion, has been replaced with a scan FF.

In the actual partial-scan designed integrated circuit, however, as shown in FIG. 10, the inputs of the two receiving blocks F and G, for example, are connected to the output of the transmitting block E. For each of the inputs, there may be an FF(s) that is accessible from the input only through the combinational circuit and is not a scan FF. In this case, the entire integrated circuit is tested with the respective test input patterns of the blocks F and G both being set through the block E. Therefore, if the respective test input patterns of the blocks F and G are to be set to different values, such values cannot be set simultaneously. This may possibly make the number of parallel test input patterns of the entire integrated circuit larger than the number of parallel test input patterns of the block F or G alone.

Thus, in the present embodiment, when there is a plurality of inputs of the receiving blocks, an FF(s) that is accessible from the input only through the combinational circuit and is not a scan FF is found as well as the number of such FFs is calculated for each input (step S56). In the case of FIG. 10, there are two FFs 11 and 12 that are accessible from the input of the block F and are not a scan FF, and a single FF 13 that is accessible from the input of the block G and is not a scan FF.

In this case, the input of the block F has the largest number of accessible FFs. In other words, the input of the block G has a less number of accessible FFs (step S57). Therefore, the FF 13 is replaced with a scan FF (step S58). This enables the block G to be mostly tested by setting the value of the scan FF 13. As a result, the number of parallel test input patterns of the integrated circuit is more likely to be governed by the maximum number of parallel test input patterns of the blocks. This results in a reduced error of the estimated value of the number of test input patterns by the tester.

(Sixth Embodiment)

A method of design for testability according to the sixth embodiment of the present invention is a method for inserting test points and determining the insertion positions of the test points so as to reduce the number of parallel test input patterns of the integrated circuit and the blocks.

Figure 11:
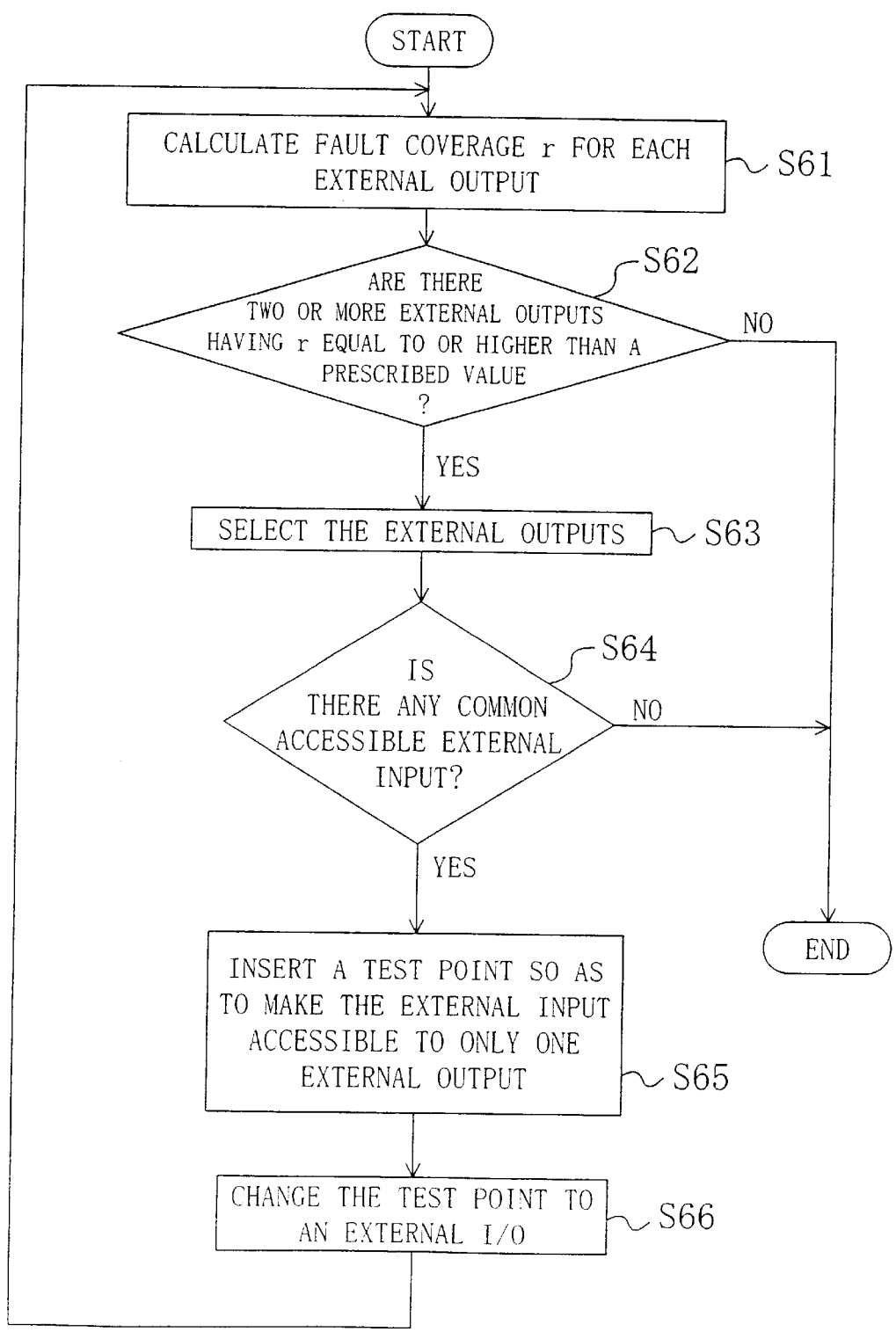
FIG. 11 is a flowchart illustrating a process flow of a method of design for testability according to a sixth embodiment of the present invention.

FIG. 11 is a flowchart illustrating a process flow in the method of design for testability according to the present embodiment. In step S61, the fault coverage r of each external output is calculated. In step S62, it is determined whether or not there exist a plurality of external outputs having the fault coverage r equal to or higher than a prescribed value. If YES in step S62, the process proceeds to step S63. Otherwise, the process is terminated.

In step S63, all external outputs having the fault coverage r equal to or higher than the prescribed value are selected. In step S64, it is determined whether or not there exists a common external input accessible from at least two of the external outputs selected in step S63. If YES in step S64, the process proceeds to step S65. Otherwise, the process is terminated.

In step S65, a test point is inserted so that the common accessible external input is accessible to only one external output. In step S66, a signal line having the test point inserted therein is changed to an external input/output (I/O). The signal line having the test point inserted therein can be equivalently regarded as an external I/O.

It is herein assumed that the fault coverage r is approximately indicated by the rate of the number of gates accessible from the external output to the total number of gates. A gate accessible to a plurality of external outputs is counted as an inverse number of the number of accessible external outputs. For example, a gate accessible to two external outputs is counted as ½ in calculation of the fault coverage.

Based on the flowchart of FIG. 11, the method of design for testability of the present embodiment will now be described in terms of a specific circuit with reference to FIGS. 12A to 15.

Figures 12A, 12B, 12C:
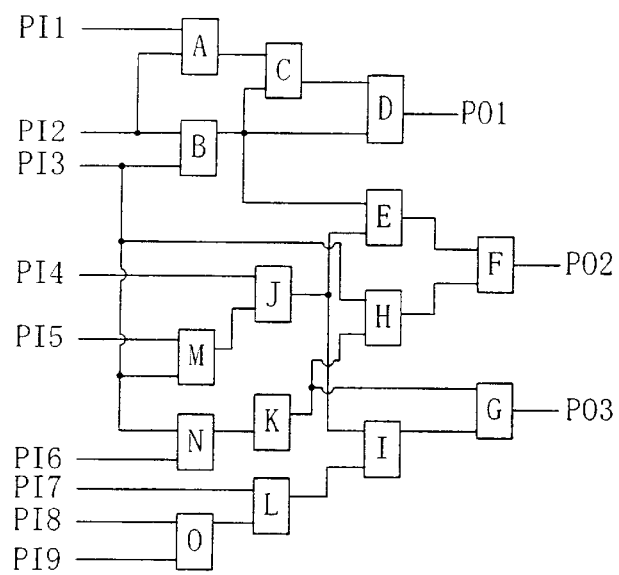
FIG. 12A is a diagram showing a combinational circuit to be subjected to test-point insertion.
FIG. 12B is a diagram showing the fault coverage of each external output in the circuit of FIG. 12A.
FIG. 12C is a diagram showing external inputs accessible from external outputs PO2 and PO3 of FIG. 12A.

FIG. 12A shows a combinational circuit to be subjected to test-point insertion. Alternatively, an integrated circuit or a block forming the integrated circuit may be subjected to the test-point insertion. In FIG. 12A, PI1 to PI9 denote external inputs, PO1 to PO3 denote external outputs, and A to O denote combinational gates. A full-scan design circuit is also modeled by a combinational circuit having outputs of scan FFs changed to external inputs and normal data inputs thereof changed to external outputs.

First, in step S61, the fault coverage, i.e., the rate of accessible gates to the total number of gates, is obtained for each external output PO1, PO2, PO3. The result is shown in FIG. 12B. For example, the external output PO1 has four accessible gates A, B, C and D. The gate B is accessible also from the external output PO2, and therefore is counted as ½. Thus, the number of accessible gates is calculated as 3.5 (=3+½). This number of accessible gates divided by the total number of gates of the circuit, i.e., 15, corresponds to the fault coverage.

Then, in steps S62 and S63, assuming that the prescribed value is 30%, external outputs having at least 30% fault coverage, i.e., external outputs PO2 and PO3, are selected.

In step S64, it is determined whether or not there is any common external input accessible from the external outputs PO2 and PO3. As shown in FIG. 12C, it is determined that the external inputs PI3, PI4, PI5 and PI6 are common external inputs accessible from the external outputs PO2 and PO3.

In step S65, test points are inserted so as to eliminate the common external inputs accessible from the external inputs PO2 and PO3, i.e., so as to make the external inputs PI3, PI4, PI5 and PI6 accessible to only one of the external outputs PO2 and PO3.

Figure 13:
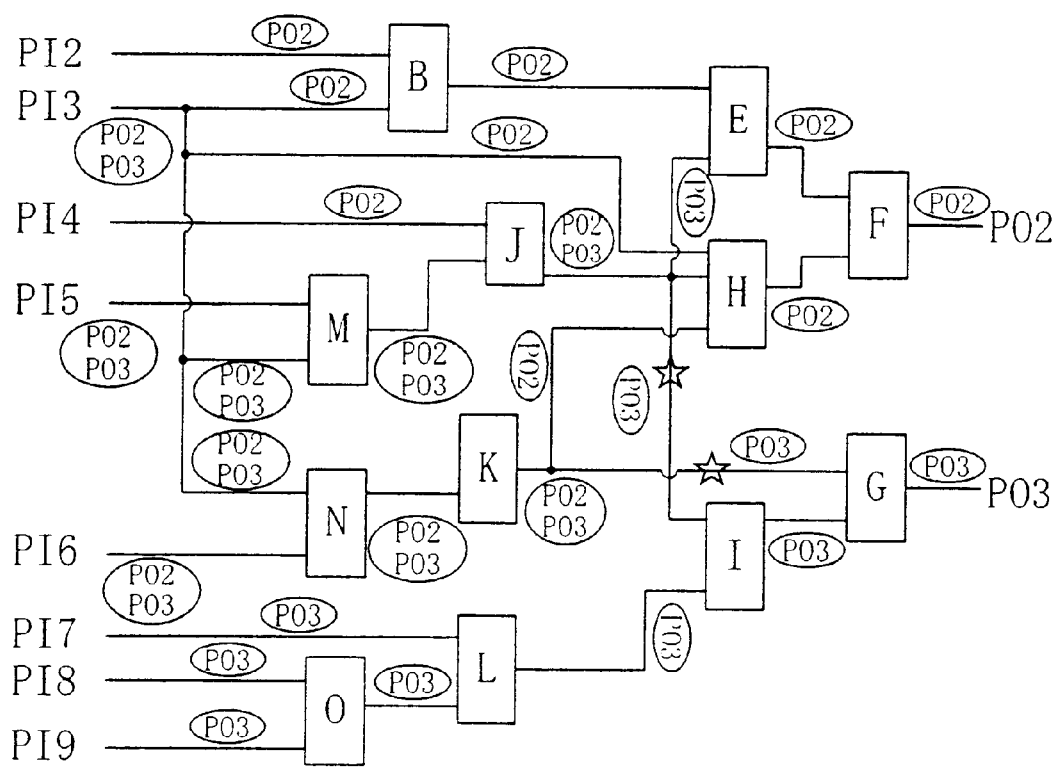
FIG. 13 is a diagram showing a combinational circuit portion of the circuit of FIG. 12A, which is accessible from the external outputs PO2 and PO3.

FIG. 13 shows only a combinational circuit portion of the circuit of FIG. 12A, which is accessible from the external outputs PO2 and PO3. This circuit portion is subjected to the test-point insertion. The circled external outputs on each signal line represent external outputs accessible through that signal line. As shown in FIG. 13, the output signal line of the gate K is accessible to both external outputs PO2 and PO3. However, each of the two branched signal lines thereof reaches only one external output. Therefore, a test point is inserted into the signal line serving both as the output of the gate K and the input of the gate G. Similarly, the output signal line of the gate J is accessible to both external outputs PO2 and PO3. However, each of the two branched signal lines thereof reaches only one external output. Therefore, a test point is inserted into the signal line serving both as the output of the gate J and the input of the gate I. Such insertion of two test points eliminates the common external inputs accessible from the external outputs PO2 and PO3.

Figures 14A, 14B:
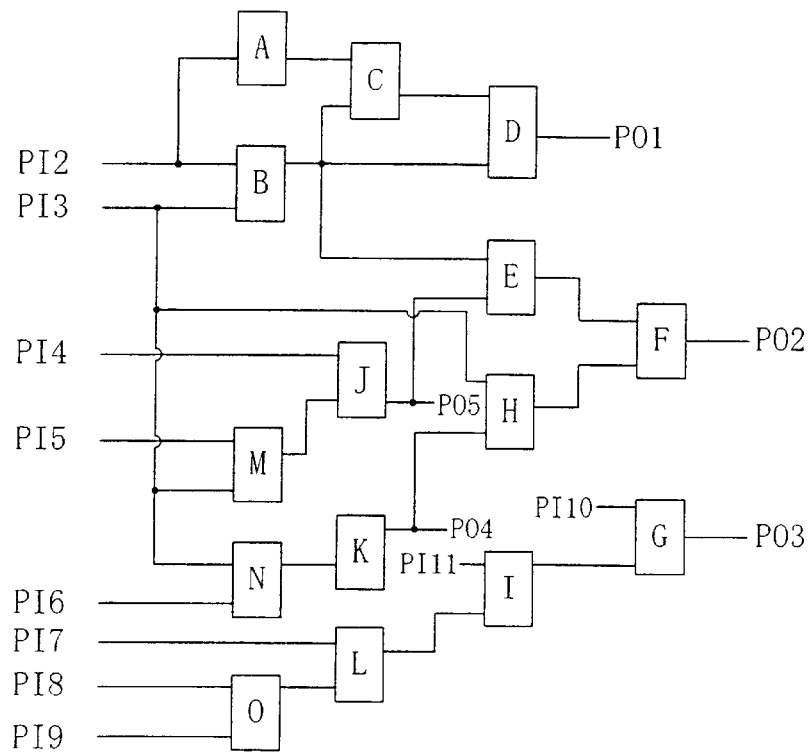
FIG. 14A is a diagram showing the circuit of FIG. 13 with its test-point-inserted signal lines changed to external input/outputs (I/Os).
FIG. 14B is a diagram showing a fault coverage of each external output in the circuit of FIG. 14A.

Then, in step S66, the signal lines having the test points inserted therein are changed to external I/Os. As shown in FIG. 14A, further external inputs PI10 and PI11 as well as further external outputs PO4 and PO5 are added.

Returning back to step S61, the fault coverage is again calculated for each external output PO1 to PO5, whereby the result as shown in FIG. 14B is obtained. In step S62, only the external output PO2 has at least 30% fault coverage (the prescribed value). Therefore, the process is terminated.

If there are many accessible common external inputs, test input patterns of the faults to be detected at different external outputs are less likely to be compressed. Therefore, by inserting the test points as in the present embodiment so as to eliminate the common external inputs accessible from a plurality of external outputs that may detect many faults, test input patterns of a plurality of external outputs can be unconditionally compressed. This enables reduction in the number of parallel test input patterns of the entire combinational circuit.

Note that, instead of the fault coverage, the number of accessible external inputs may be calculated for each external output and used to select external outputs in steps S62 and S63.

Figure 15:
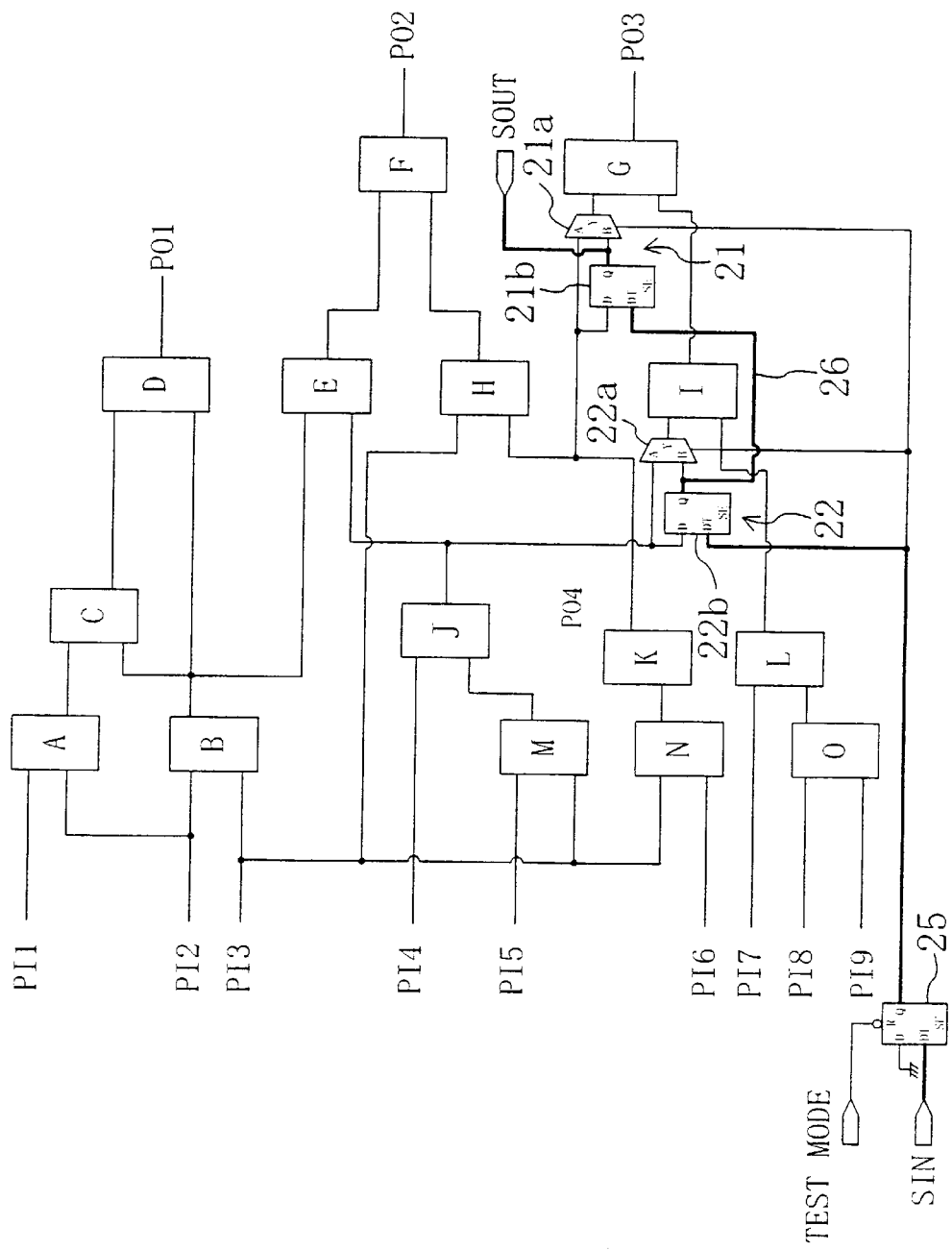
FIG. 15 is a diagram showing the combinational circuit of FIG. 12A having test circuits respectively inserted at determined test-point positions.
Figure 21:
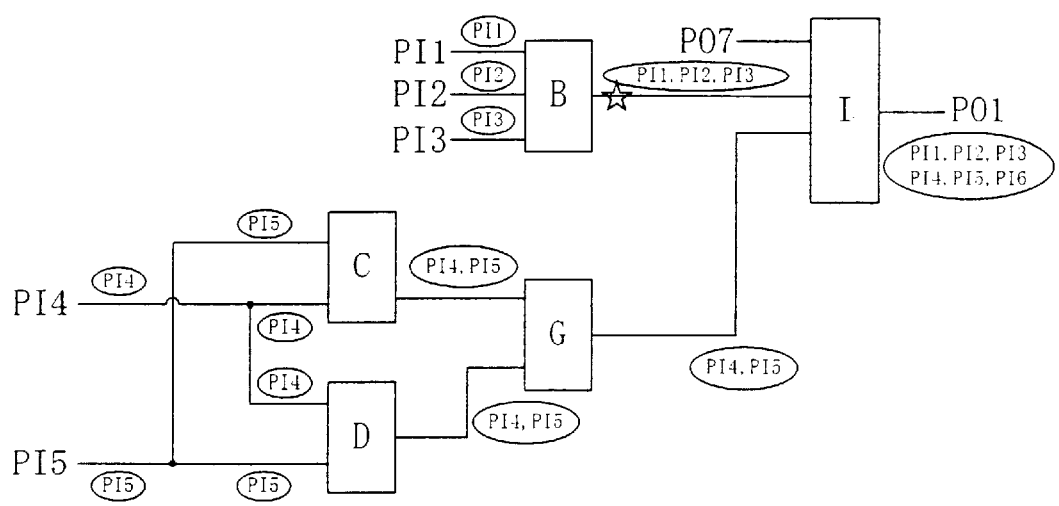
FIG. 21 is a diagram showing only a combinational circuit portion of the circuit of FIG. 20A, which is accessible from the external output PO1.

FIG. 15 shows the combinational circuit of FIG. 12A having the test circuits respectively inserted at the determined test-point positions. In FIG. 15, 21 and 22 denote test circuits. The test circuit 21 is formed from a two-input testing selector 21a and testing scan FF 21b. The test circuit 22 is formed from a two-input testing selector 22a and a testing scan FF 22b.

Moreover, 25 denotes a resettable scan FF for controlling a selection signal of the two-input selectors 21a and 21b, and 26 denotes a scan path formed from a scan-IN SIN, scan FFS 25, 22b and 21b, and a scan-OUT SOUT. The scan FF 25 is formed so that its data input D is fixed to a value of the selection signal for the normal operation of the two-input selectors 21a, 21b, and a reset value of the scan FF 25 at its reset input R is disenabled during scan testing. The test mode is disenabled ("0") during scan testing, and enabled ("0") during normal operation. The scan FF 25 conducts a normal operation when the reset input R is "0".

Conventionally, when a test circuit is inserted into the circuit, the selection signal lines of the two-input selectors are fixed to the test mode. Therefore, the respective signal lines of the A input of the selector 21a and the A input of the selector 22a cannot be tested. In contrast, in the present embodiment, the selector-controlling scan FF 25 is provided as shown in FIG. 15, enabling testing of such signal lines. During normal operation, the reset of the scan FF 25 is activated, so that both two-input selectors 21a and 22a select a normal signal line.

Figure 16A:
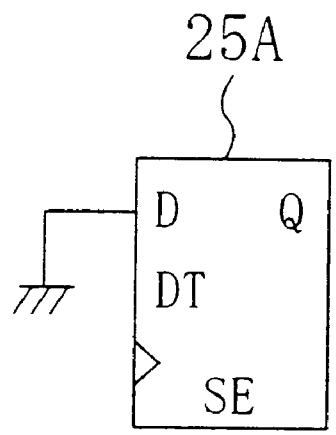
FIGS. 16A and 16B are diagrams showing other examples of a selector-controlling scan FF.
Figure 16B:
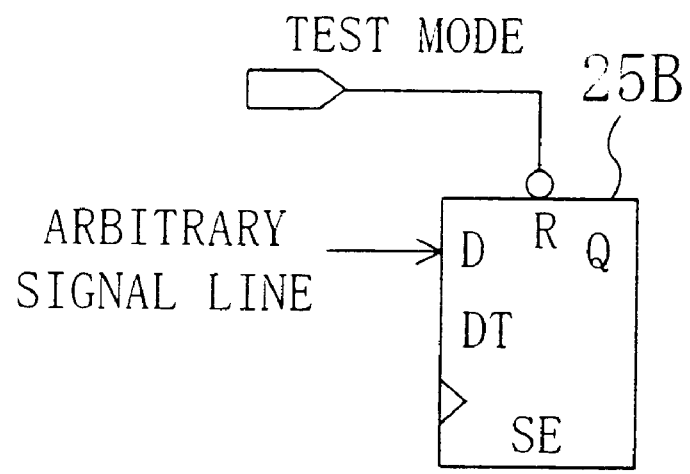

FIGS. 16A and 16B show other examples of the scan FF 25. In the scan FF 25A of FIG. 16A, the data input D is fixed to the value of the selection signal for the normal operation of the two-input selectors 21a and 22a. Since the normal operation is carried out with one clock, no test mode pin is required. In the scan FF 25B of FIG. 16B, an arbitrary signal line, e.g., a less observable signal line, can be connected to the normal data input D, implementing a further improved fault coverage.

Note that the structure including the scan FF for controlling the selection signal of the two-input selectors as shown in FIG. 15 is also applicable when the test-point positions are determined by a method other than that of the present embodiment.

(Seventh Embodiment)

As in the sixth embodiment, a method of design for testability according to the seventh embodiment of the present invention is also a method for inserting test points and determining the insertion positions of the test points so as to reduce the number of parallel test input patterns of the integrated circuit and the blocks.

Figure 17:
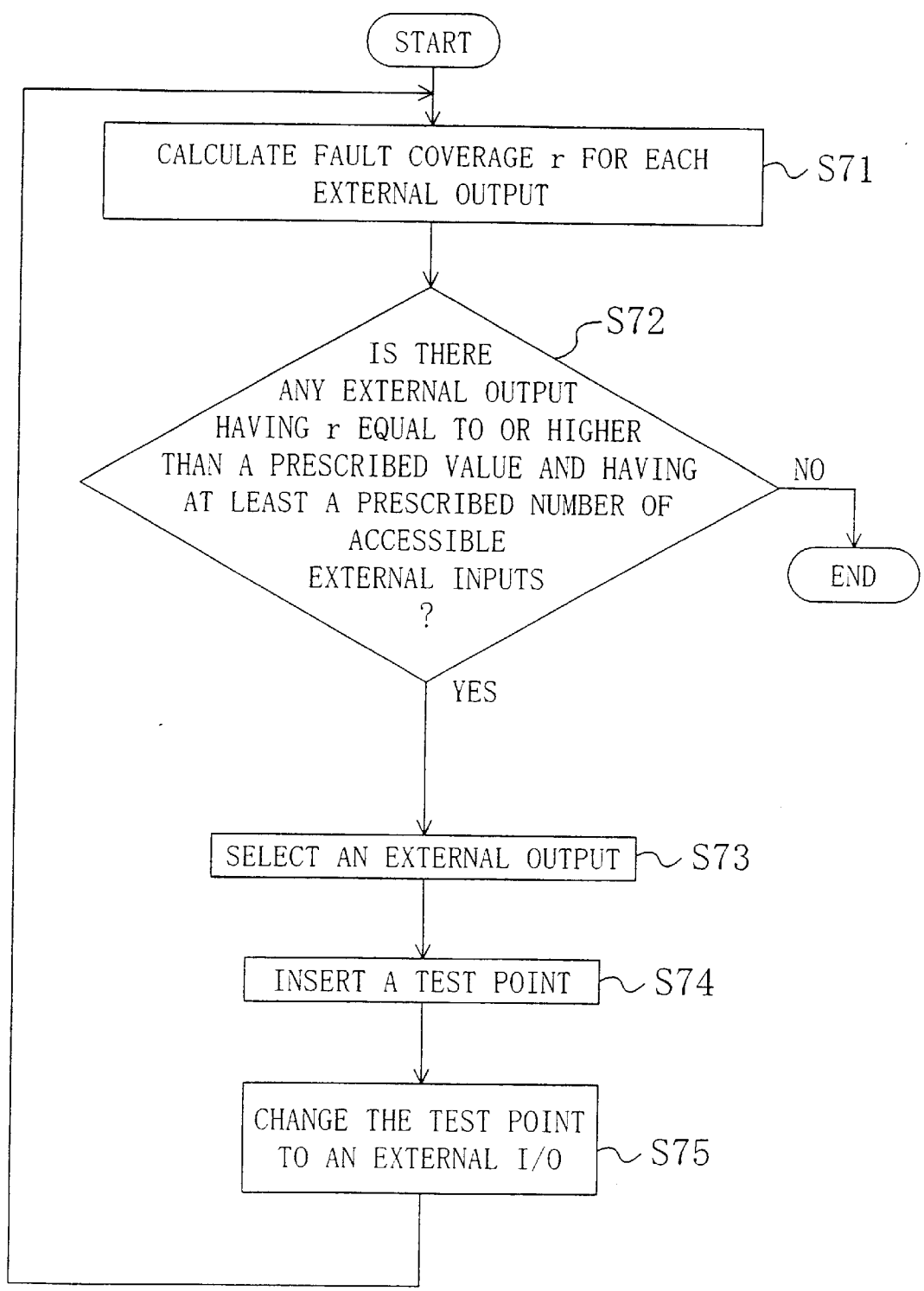
FIG. 17 is a flowchart illustrating a process flow of a method of design for testability according to a seventh embodiment of the present invention.

FIG. 17 is a flowchart illustrating a process flow in the method of design for testability according to the present embodiment. In step S71, the fault coverage r of each external output is calculated. Step S71 is the same as step S61 of the sixth embodiment. In step S72, it is determined whether or not there exists any external output having the fault coverage r equal to or higher than a prescribed value as well as having at least a prescribed number of accessible external inputs. If YES in step S72, the process proceeds to step S73. Otherwise, the process is terminated.

In step S73, one of the external outputs having the fault coverage r equal to or higher than the prescribed value as well as having at least the prescribed number of accessible external inputs is selected. In step S74, one of the signal lines accessible from the external output selected in step S73, i.e., a signal line having the largest number of accessible external inputs among the signal lines, is selected for test-point insertion. In step S75, the signal line having the test point inserted therein is changed to an external I/O. If a plurality of signal lines have the largest number of accessible external inputs in step S74, a fan-out stem that is likely to affect many signal lines as a result of test-point insertion is preferentially selected.

Based on the flowchart of FIG. 17, the method of design for testability of the present embodiment will now be described in terms of a specific circuit with reference to FIGS. 18A to 22B.

Figures 18A, 18B:
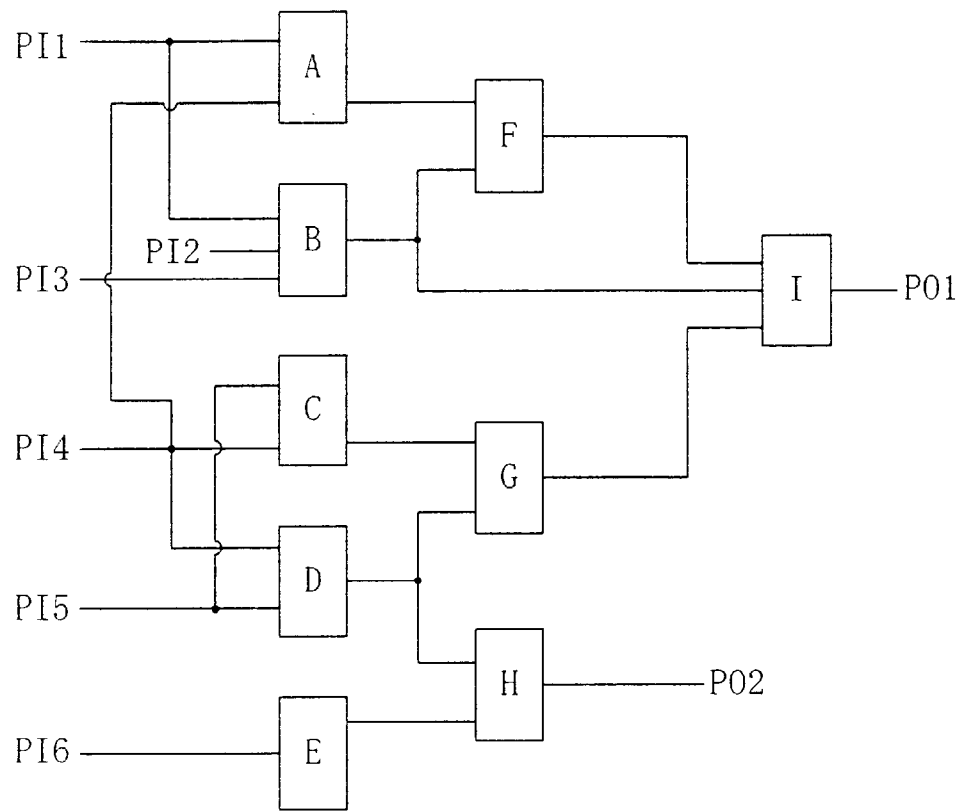
FIG. 18A is a diagram showing a combinational circuit to be subjected to test-point insertion.
FIG. 18B is a diagram showing a fault coverage of each external output in the circuit of FIG. 18A.

FIG. 18A shows a combinational circuit to be subjected to test-point insertion. In FIG. 18A, PI1 to PI6 denote external inputs, PO1 and PO2 denote external outputs, and A to I denote combinational gates. A full-scan design circuit is also modeled by a combinational circuit having outputs of scan FFs changed to external inputs and normal data inputs thereof changed to external outputs.

The fault coverage is herein obtained from the gates, but can also be obtained from the signal lines. First, in step S71, the fault coverage, i.e., the rate of accessible gates to the total number of gates, is obtained for each external output PO1, PO2. The result is shown in FIG. 18B. For example, the external output PO2 has three accessible gates D, E and H. The gate D is accessible also from the external output PO1, and therefore is counted as ½. Thus, the number of accessible gates is calculated as 2.5 (=2+½). This number of accessible gates divided by the total number of gates of the circuit, i.e., 9, corresponds to the fault coverage.

Then, in steps S72 and S73, an external output having at least 40% fault coverage as well as having at least five accessible external inputs is selected. Herein, the external output PO1 is selected.

Figure 19:
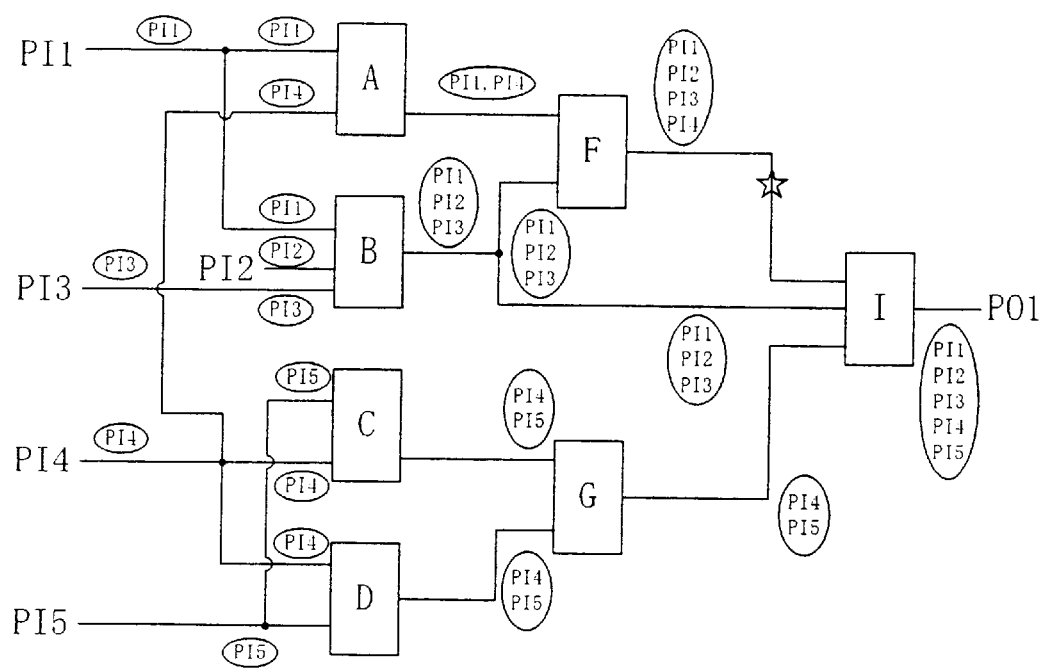
FIG. 19 is a diagram showing only a combinational circuit portion of the circuit of FIG. 18A, which is accessible from an external output PO1.
Figures 20A, 20B:
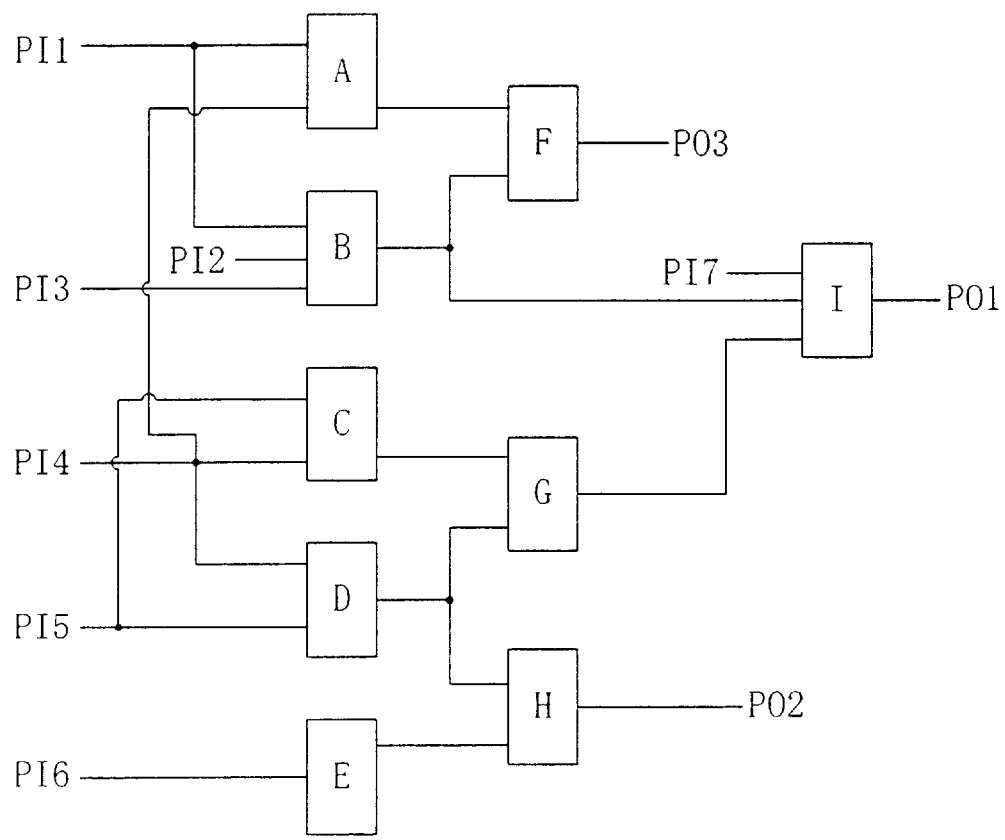
FIG. 20A is a diagram showing the circuit of FIG. 19 with its test-point-inserted signal line changed to an external I/O.
FIG. 20B is a diagram showing a fault coverage of each external output in the circuit of FIG. 20A.

In step S74, a test point is inserted. FIG. 19 shows only a combinational circuit portion of the circuit of FIG. 18A, which is accessible from the external output PO1. This circuit portion is subjected to the test-point insertion. The circled external inputs on each signal line represent external inputs accessible through that signal line. In FIG. 19, a test point is inserted into the signal line between the gates I and F, i.e., a signal line having the largest number (but less than five) of accessible external inputs (i.e., four accessible external inputs). Then, in step S75, the signal line having the test point inserted therein is changed to an external I/O. As shown in FIG. 20A, a further external input PI7 and a further external output PO3 are added.

Returning back to step S71, the fault coverage is again calculated for each external output. The result is shown in FIG. 20B. In steps S72 and S73, it is determined that the external output PO1 has at least 40% fault coverage and also has at lest five accessible external inputs. Therefore, the external output PO1 is again selected.

Figures 22A, 22B:
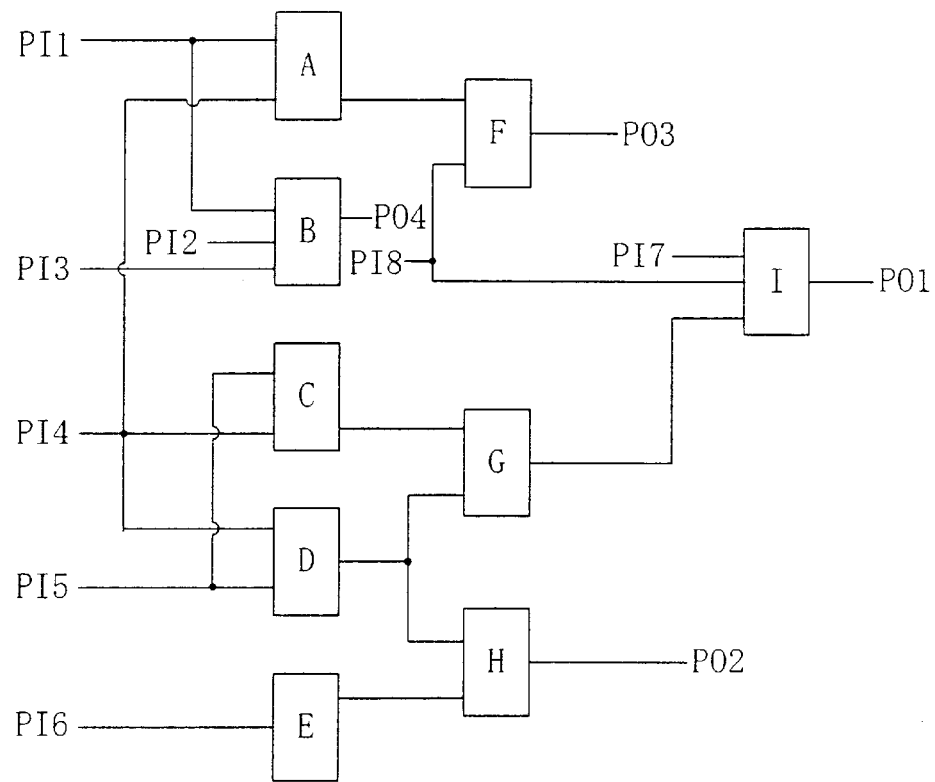
FIG. 22A is a diagram showing the circuit of FIG. 21 with its test-point-inserted signal line changed to an external I/O.
FIG. 22B is a diagram showing a fault coverage of each external output in the circuit of FIG. 22A.

Then, in step S74, a test point is inserted. FIG. 21 shows only a combinational circuit portion of the circuit of FIG. 20A, which is accessible from the external output PO1. This circuit portion is subjected to the test-point insertion. In FIG. 21, a test point is inserted into the signal line between the gates I and B, i.e., a signal line having the largest number (but less than five) of accessible external inputs (i.e., three accessible external inputs). Then, in step S75, the signal line having the test point inserted therein is changed to an external I/O. As shown in FIG. 22A, a further external input PI8 and a further external output PO4 are added.

Returning back to step S71, the fault coverage is again calculated for each external output. The result is shown in FIG. 22B. In step S72, it is determined that there is no external output having at least 40% fault coverage as well as having at least five accessible external inputs. Therefore, the process is terminated.

If there are many external inputs accessible to a certain external output, the value of the test input pattern for the fault to be detected at that external output is likely to be assigned to these many accessible external inputs, thereby possibly degrading the compression efficiency of the test input patterns. Accordingly, by inserting the test point as in the present embodiment so as to reduce the number of external inputs accessible from the external output that may detect many faults and has many accessible external inputs, the compression efficiency of the test input patterns of the external output that may detect many faults can be improved. As a result, the number of parallel test input patterns of the entire combinational circuit can be reduced.

The insertion position of the test point may alternatively be determined so as to make the maximum value of the probability that the value is assigned to the external input (hereinafter, referred to as "value-assignment probability of the external input") equal to or smaller than a prescribed value. Herein, the value-assignment probability of the external input is the sum of the respective fault coverage of the external outputs accessible from that external input.

For example, in the circuit of FIG. 18A, each of the external inputs PI1, PI2 and PI3 is accessible only to the external output PO1. Therefore, the value-assignment probability thereof is 72.2%. Since each of the external inputs PI4 and PI5 is accessible to both external outputs PO1 and PO2, the value-assignment probability thereof is 100%. Since the external input PI6 is accessible only to the external output PO2, the value-assignment probability thereof is 27.8%.

Figures 23A, 23B:
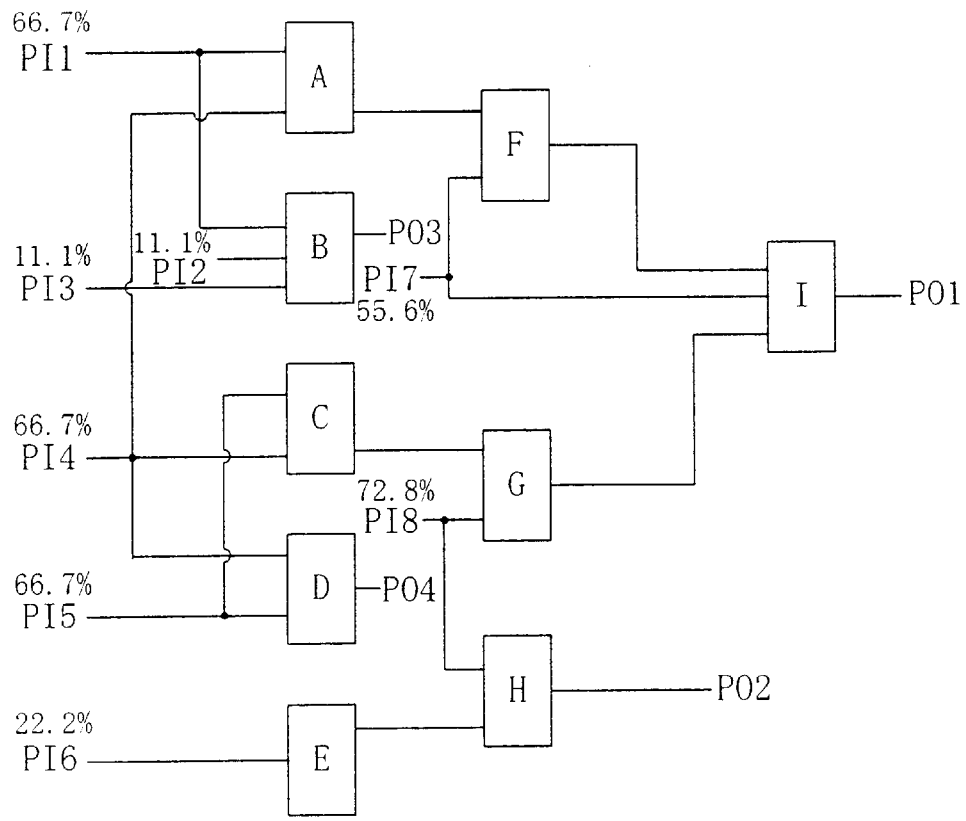
FIGS. 23A and 23B are diagrams showing the result of test-point insertion into fan-out stems of the circuit of FIG. 18A.

It is now assumed that the maximum value of the value-assignment probability of the external input is to be 80% or less. In this case, a test point is inserted at the gate of the fan-out stem. This is because the fan-out stem causes an increase in the number of accessible external outputs. Herein, a test point is inserted at the gates B and D of the fan-out stems. Thus, the result as shown in FIGS. 23A and 23B is obtained. As can be seen from FIGS. 23A and 23B, the maximum value of the value-assignment probability of the external input is 77.8% for the external input PI8.

(Eighth Embodiment)

As in the sixth embodiment, a method of design for testability according to the eighth embodiment of the present invention is also a method for inserting test points and determining the insertion positions of the test points so as to reduce the number of parallel test input patterns of the integrated circuit and the blocks.

Figure 24:
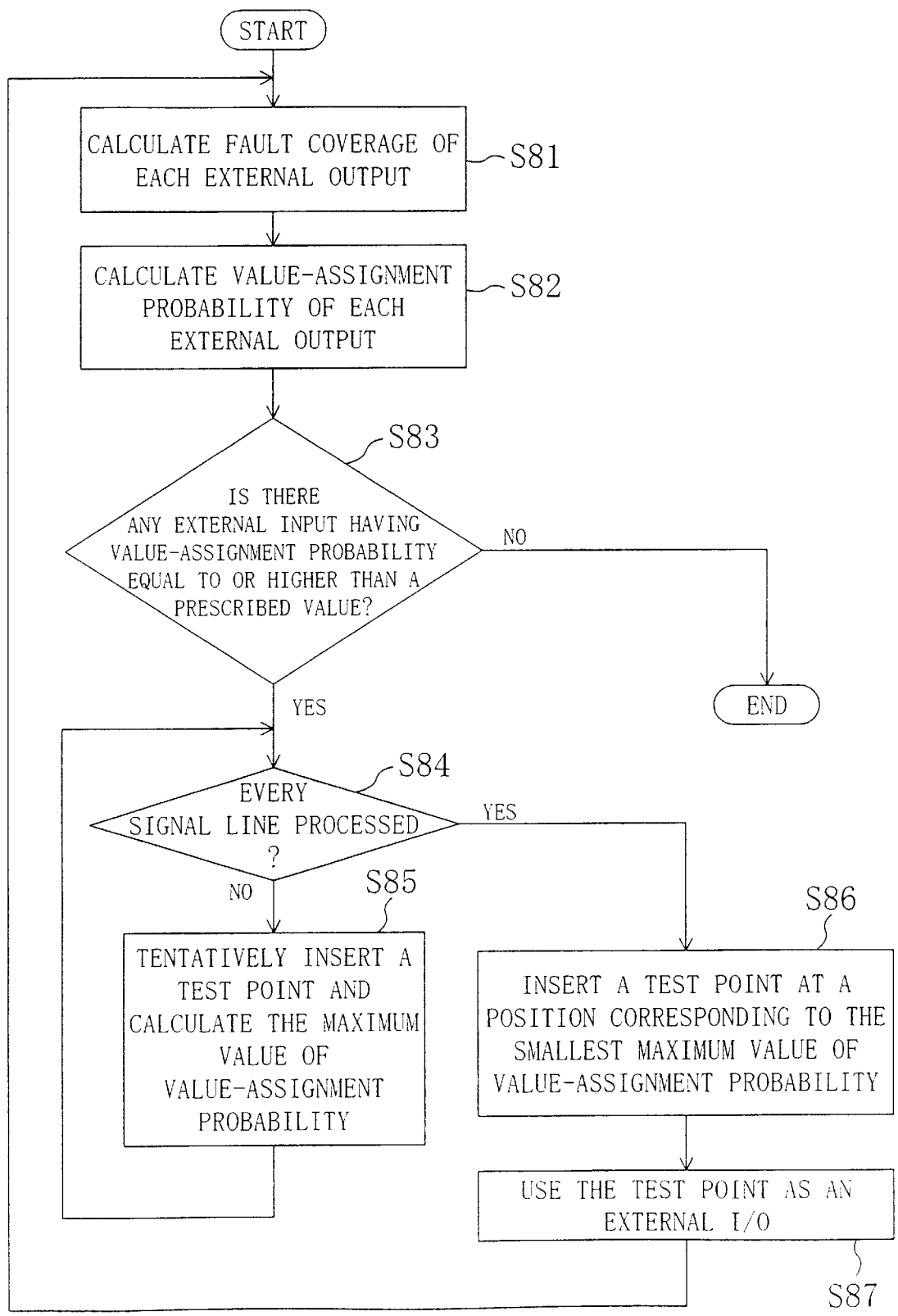
FIG. 24 is a flowchart illustrating a process flow of a method of design for testability according to an eighth embodiment of the present invention.

FIG. 24 is a flowchart illustrating a process flow in the method of design for testability according to the eighth embodiment of the present invention. In step S81, the fault coverage of each external output is calculated for the integrated circuit or the block that is subjected to the design for testability. Herein, the fault coverage is the same as that defined in the sixth embodiment. In step S82, the probability that a value is assigned to the external input upon fault detection is calculated for each external input. This probability is calculated as the sum of the respective fault coverage of the external outputs accessible from that external input, and is herein referred to as the "value-assignment probability". In step S83, it is determined whether or not there is any external input having the value-assignment probability equal to or higher than a prescribed value. If YES in step S83, the process proceeds to step S84. Otherwise, the process is terminated.

In step S84, it is determined whether or not every signal line to which a test point can be inserted has been processed. If YES in step S84, the process proceeds to step S86. Otherwise, the process proceeds to step S85. In step S85, a test point is tentatively inserted and the inserted test point is regarded as an external I/O so as to calculate the value-assignment probability of each external input. Then, the process returns to step S84. In step S86, a test point is inserted at a position corresponding to the smallest maximum value of the value-assignment probability, i.e., at the most-effective position, based on the value-assignment probabilities calculated in step S85. In step S87, the test point inserted in step S86 is used as an external I/O, and the process returns to step S81.

It is now assumed that a test pattern has been produced for a certain fault in the circuit. In this case, if the value is assigned to many external inputs, the input pins used for the produced test pattern may possibly be used also for a test pattern produced for another fault. Therefore, the test patterns are less likely to be compressed, increasing the pattern length. In view of this, the present embodiment determines the insertion position of a test point so as to reduce the value-assignment probability of the external input.

Figures 25A, 25B, 25C:
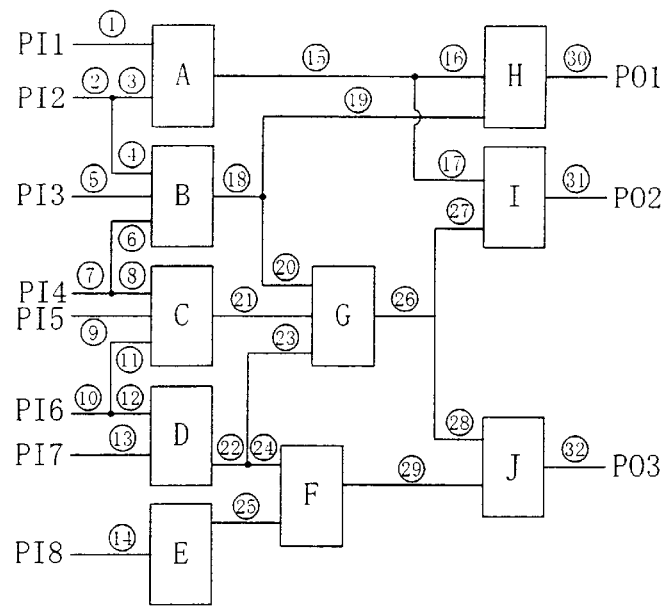
FIG. 25A is a diagram showing a combinational circuit to be subjected to test-point insertion.
FIG. 25B is a diagram showing a fault coverage of each external output in the circuit of FIG. 25A.
FIG. 25C is a diagram showing a value-assignment probability of each external input in the circuit of FIG. 25A.

Based on the flowchart of FIG. 24, the method of design for testability of the present embodiment will now be described in terms of a specific circuit with reference to FIGS. 25A and 25B. FIG. 25A shows a combinational circuit to be subjected to test-point insertion. In FIG. 25A, PI1 to PI8 denote external inputs, PO1 to PO3 denote external outputs, A to J denote combinational gates, and (1) to (32) denote signal lines to which a test point can be inserted. Note that a full-scan design circuit can also be modeled by a combinational circuit having outputs of scan FFs changed to external inputs and normal data inputs thereof changed to external outputs, and the insertion position of the test point can be determined in the same manner as that of the present embodiment.

First, in step S81, the fault coverage of each of the external outputs PO, PO2 and PO3, i.e., the rate of the number of accessible gates to the total number of gates, is obtained. FIG. 25B shows the obtained fault coverage. For example, the external output PO1 has three accessible gates A, B and H. The gate A is accessible from the external output PO2 in addition to the external output PO1. In other words, the external outputs PO1 and PO2 detect the faults of the gate A and the external output PO1 detects one-half of the faults of the gate A. Similarly, the gate B is accessible from the external outputs PO2 and PO3 in addition to the external output PO1. Therefore, the external output PO1 detects one-third of the faults of the gate B. Since the gate H is accessible only from the external output PO1, the external output PO1 detects every fault of the gate H. Since there are ten gates in total, the rate of the number of gates accessible from the external output PO1 to the total number of gates can be obtained as follows:

$$[\{(1/2)+(1/3)+1\}/10] \times 100 = 18.3 \ (\%).$$

The fault coverage can be similarly obtained for the other external outputs PO2 and PO3.

Then, in step S82, the value-assignment probability of each external input, i.e., the sum of the respective fault coverage of the external outputs accessible from that external input, is obtained. FIG. 25C shows the obtained value-assignment probabilities. For example, the external input PI1 is accessible to the external outputs PO1 and PO2. Therefore, the value-assignment probability of the external input PI1 is the sum of the respective fault coverage of the external outputs PO1 and PO2, i.e., 51.6%. The value-assignment probability can be similarly obtained for the other external inputs PI2 to PI8.

Then, in step S83, it is determined whether or not there is any external input having the value-assignment probability equal to or higher than a prescribed value. The external inputs PI2 to PI4 have 100% value-assignment probability, and the external inputs PI5 to PI7 have 76.6% value-assignment probability. Assuming that the prescribed value of the value-assignment probability is 70%, the value-assignment probabilities of the external inputs PI2 to PI4 and PI5 to PI7 exceed the prescribed value. Therefore, the process proceeds to step S84. In step S84, not all positions to which a test point can be inserted have been processed. Accordingly, the process proceeds to step S85.

Figures 26A, 26B:
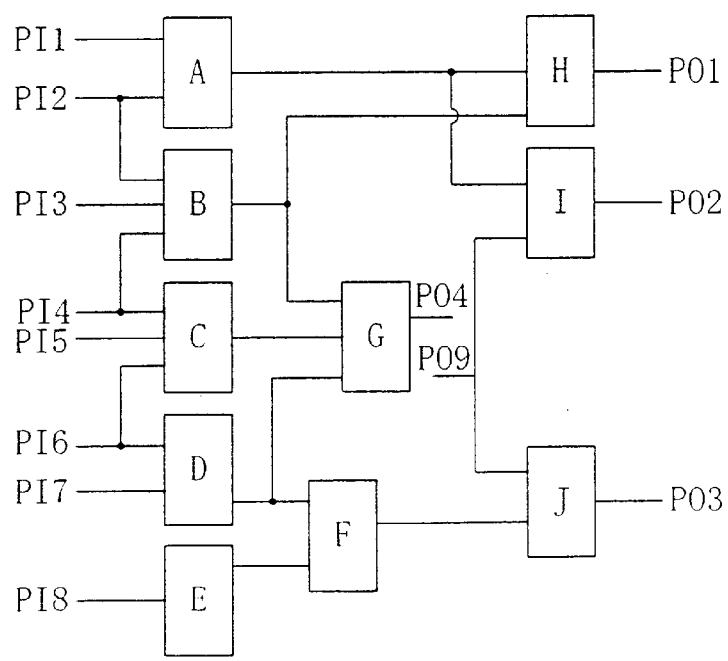
FIG. 26A is a diagram showing the maximum values of the value-assignment probability as a result of test-point insertion.
FIG. 26B is a diagram showing the circuit of FIG. 25A having a test point inserted in a signal line (26).

In step S85, a test point is tentatively inserted to every position to which the test point can be inserted, and the inserted test points are regarded as external I/Os so as to obtain the value-assignment probability of each external input in the same manner as that of steps S81 and S82. FIG. 26A shows the insertion positions of the test points and the maximum values of the value-assignment probability as a result of the test-point insertion, as calculated in step S85.

In step S86, an actual insertion position is determined based on the result of FIG. 26A, and the test point is inserted. It is herein assumed that the signal line (26) corresponding to the smallest maximum value of the value-assignment probability is preferentially determined as the insertion position, and a test point is inserted thereto. In step S87, the test point inserted in the signal line (26) in step S86 is changed to an external I/O. The resultant circuit is shown in FIG. 26B. Then, the process returns to step S81.

In step S81, the fault coverage of each external output PO1, PO2, PO3, PO4 is obtained. FIG. 27A shows the obtained fault coverage. In step S82, the value-assignment probability of each external input is obtained. FIG. 27B shows the obtained value-assignment probabilities. It can be seen from FIG. 27B that the maximum value of the value-assignment probability is reduced from that of FIG. 25C. In step S83, the maximum value of the value-assignment probability is 65%, which is smaller than the prescribed value (70%). Therefore, the process is terminated.

As has been described above, the present embodiment enables a test point to be inserted into a signal line so as to reduce the value-assignment probability of the external input. As a result, when a test pattern for a certain fault within the circuit is produced, the number of external inputs to which the value is assigned is more likely to be reduced, and therefore the test pattern is more likely to be compressed with another test pattern. As a result, the test time using the tester can be reduced.

Note that a scan design circuit can also be modeled by a combinational circuit having outputs of scan FFs changed to external inputs and normal data inputs thereof changed to external outputs. Therefore, a signal line to which a test point is inserted can be determined in the same manner as that of the present embodiment.

(Ninth Embodiment)

Minimizing the maximum value of the value-assignment probability of the external inputs within the circuit (n signal lines) by insertion of a fixed number (m) of test points will now be considered. In this case, the computation amount corresponds to the number of combinations of selecting m from n. Since n is generally at least several tens of thousands and m is at least several tens, the computation amount explodes. In the present embodiment, test points are selected according to the following heuristic algorithm.

FIG. 28 shows a heuristic algorithm for selecting test points according to the present embodiment. Assumed that the limit value of the number of test points to be inserted is m, it is determined in step S91 whether or not m test points are currently selected. If YES in step S91, the process is terminated. Otherwise, the process proceeds to step S92. In step S92, the respective fault coverage of the external outputs as well as the respective value-assignment probabilities of all signal lines in the circuit are calculated. In step S93, some candidate signal lines are selected from the representative signal lines. In step S94, a signal line for test-point insertion is selected from the candidate signal lines.

Figure 29:
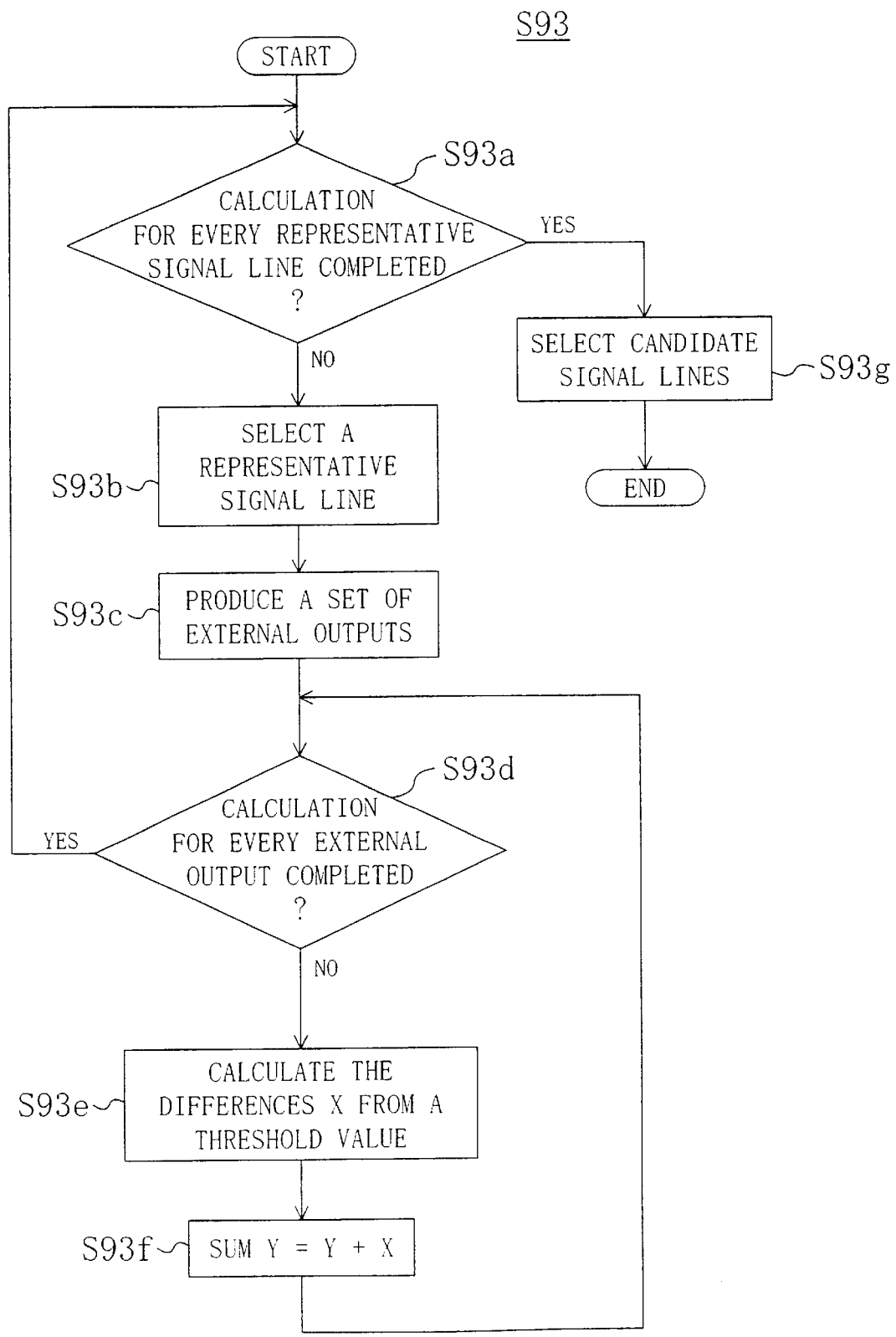
FIG. 29 is a flowchart specifically illustrating step S93 in the flow of FIG. 28.

FIG. 29 shows a detailed algorithm of step S93 of FIG. 28. In step S93a, it is determined whether or not cost calculation described below has been completed for every representative signal line in the circuit. If YES in step S93a, the process proceeds to step S93g. Otherwise, the process proceeds to step S93b. In step S93b, one of the representative signal lines for which cost calculation has not been conducted is selected. In step S93c, a set of external outputs accessible to the selected representative signal line (a first set) is produced.

In step S93d, it is determined whether or not every external output in the first set has been processed. If YES in step S93d, the process returns to step S93a. Otherwise, the process proceeds to step S93e. In step S93e, one of the external outputs is selected from the first set, and a set of external inputs accessible from that external output (a second set) is produced so as to calculate the sum of the differences between a threshold value (specified) of the value-assignment probability and the respective value-assignment probabilities of the external inputs in the second set which have the value-assignment probability equal to or higher than the threshold value. In step S93f, the total (cost) of the sum thus calculated in step S93e is calculated for the external outputs of the first set. In step S93g, a specified number of candidate signal lines for test-point insertion are selected from the representative signal lines in descending order of the cost.

Figure 30:
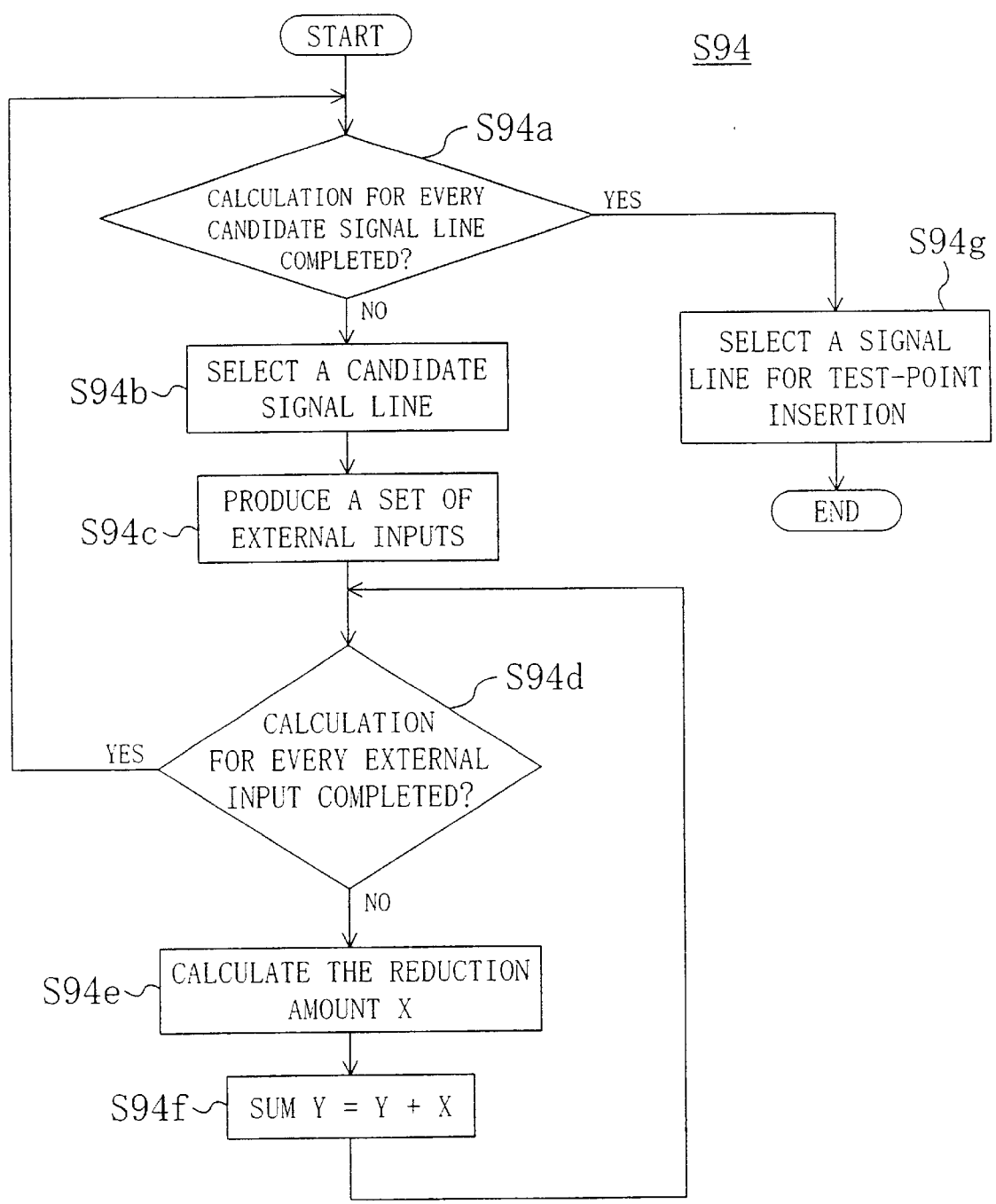
FIG. 30 is a flowchart specifically illustrating step S94 in the flow of FIG. 28.

FIG. 30 shows a detailed algorithm of step S94 of FIG. 28. In step 94a, it is determined whether or not cost calculation described below has been conducted for every candidate signal line. If YES in step S94a, the process proceeds to step S94g. Otherwise, the process proceeds to step S94b. In step S94b, one of the candidate signal lines for which cost calculation has not been conducted is selected. In step S94c, a set of external inputs accessible to the selected candidate signal line and having a value-assignment probability equal to or higher than the threshold value (a third set) is produced.

In step S94d, it is determined whether or not the reduction amount has been calculated for every external input in the third set. If YES in step S94d, the process returns to step S94a. Otherwise, the process proceeds to step S94e. In step S94e, one of the external inputs in the third set is selected, and the sum of the respective fault coverage of the external outputs that will become no longer accessible from the selected external input upon disconnecting the candidate signal line is calculated. In step S94f, the total (cost) of the sum thus calculated in step S94e is calculated for the external inputs of the third set. In step S94g, one of the candidate signal lines, which has the highest cost, is selected as a signal line for test-point insertion.

The algorithm according to the present embodiment will now be described in terms of a specific circuit.

Figure 31:
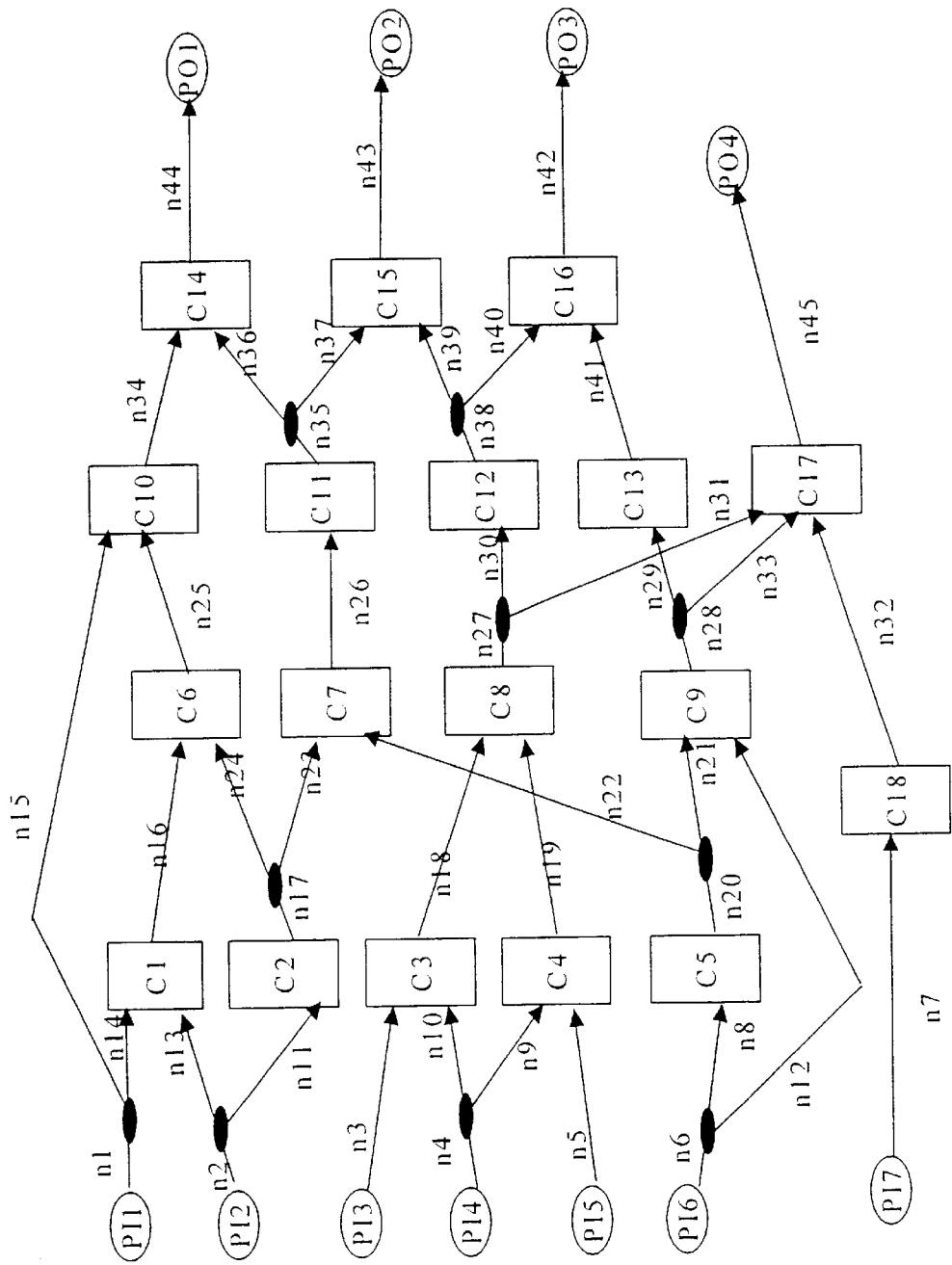
FIG. 31 is a diagram showing a combinational circuit to which the method of the ninth embodiment is to be applied.

FIG. 31 shows a combinational circuit to which a heuristic algorithm for test-point selection according to the present embodiment is applied. In FIG. 31, PI1 to PI7 denote external inputs, PO1 to PO4 denote external outputs, C1 to C18 denote combinational logic gates, and n1 to n45 denote signal lines. It is herein assumed that the number of test points to be inserted is two, and the number of candidate signal lines is three (or more if they have the same cost value), and the threshold value of the value-assignment probability is 50%.

FIGS. 32A and 32B shows the result of step S92 for the circuit of FIG. 31. FIG. 32A shows the calculation result of the fault coverage of the external outputs, and FIG. 32B shows the calculation result of the value-assignment probability of the external inputs.

It is herein assumed that the representative signal lines are the signal lines that are fan-out stems (branching lines) and that have a value-assignment probability higher than the maximum value of the fault coverage of the external output as well as lower than the maximum value of the value-assignment probability of the external input. It can be appreciated from FIGS. 32A and 32B that the representative signal lines herein are the signal lines that are fan-out stems and that have a value-assignment probability higher than 31.11% as well as lower than 100%. More specifically, the representative signal lines are the signal lines n2, n4, n17, n27, n28, n35 and n38.

It is preferable that as many external inputs as possible have a reduced value-assignment probability as a result of test-point insertion. In this respect, the fan-out stems are the signal lines causing an increase in the number of accessible external outputs. Such an increased number of accessible external outputs would cause many external inputs to have a reduced value-assignment probability due to reduction in the fault coverage of the external outputs. Moreover, inserting a test point to a fan-out stem located near the external input or external output is hardly effective in terms of reduction in the value-assignment probability. Accordingly, signal lines having a value-assignment probability higher than the maximum value of the fault coverage of the external output as well as lower than the maximum value of the value-assignment probability of the external input are determined as the representative signal lines.

FIG. 33 shows the cost calculation result (step S93) of each representative signal line. For the signal line n2, the accessible external outputs are PO1 and PO2 (a first set). Among the external inputs accessible to the external output PO1 (a second set), the external inputs having a value-assignment probability equal to or higher than the threshold value are PI2 and PI6. The sum of the differences between the threshold value and the respective value-assignment probabilities of the external inputs PI2 and PI6 is calculated as follows:

$$(55.92-50)+(100-50)=55.92.$$

Among the external inputs accessible to the external output PO2 (a second set), the external inputs having a value-assignment probability equal to or higher than the threshold value are PI2, PI3, PI4, PI5 and PI6. The sum of the differences between the threshold value and the respective value-assignment probabilities of the external inputs PI2, PI3, PI4, PI5 and PI6 is calculated as follows:

$$(55.92-50)+(68.89-50)+(68.89-50)+(68.89\ 50)+(100-50)=112.59.$$

The sum of these values, i.e., the cost of the signal line n2, is calculated as follows:

$$55.92+112.59=168.51.$$

The cost of the other representative signal lines is calculated similarly. Based on the result of FIG. 33, the signal lines n4, n27 and n38 having large cost values are selected as candidate signal lines (step S93g).

FIG. 34 shows the cost calculation result (step S94) of each candidate signal line. For the signal line n27, the external inputs accessible to the signal line n27 and having a value-assignment probability exceeding the threshold value are PI3, PI4 and PI5. For the external input PI3, the external outputs that will become no longer accessible from the external input PI3 upon disconnecting the signal line n27 are PO2, PO3 and PO4. Therefore, significant reduction in the value-assignment probability can be expected for the external input PI3. More specifically, the reduction amount is calculated as follows:

23.71+22.59+22.59=68.89.

Similarly, the respective reduction amounts of the external inputs PI4 and PI5 are 68.89. Therefore, the sum of these values, i.e., the cost of the signal line n27, is calculated as follows:

68.89+68.89+68.89=206.67.

Cost calculation of the other candidate signal lines is similarly conducted as shown in FIG. 34. Based on the result of FIG. 34, the candidate signal line n27 having the highest cost value is selected as a signal line for test-point insertion.

Figure 35:
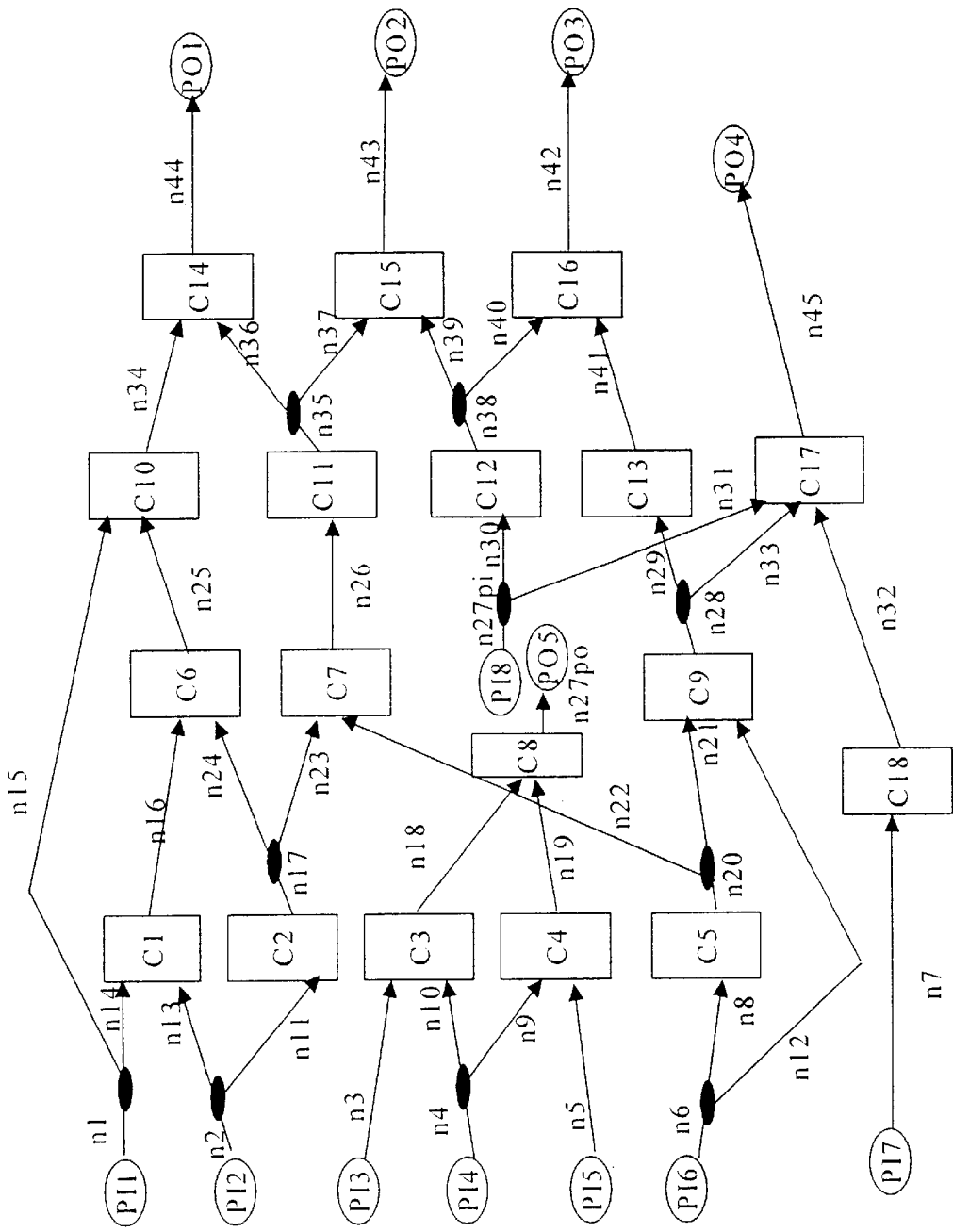
FIG. 35 is a diagram showing a circuit model of the circuit of FIG. 31 having a test point inserted in a signal line n27.

FIG. 35 shows a circuit model having a test point inserted in the signal line n27. As a result of test-point insertion, the signal line n27 is divided into n27*pi* and n27*po*, which are respectively connected to a further external input PI8 and a further external output PO5.

FIGS. 36A and 36B shows the result of step S92 for the circuit of FIG. 35. FIG. 36A shows the calculation result of the fault coverage of the external outputs, and FIG. 36B shows the calculation result of the value-assignment probability of the external inputs. It is appreciated from the result of FIGS. 36A and 36B that the representative signal lines herein are the signal lines that are fan-out stems and that have a value-assignment probability higher than 30.98% as well as lower than 82.60%. More specifically, the representative signal lines are the signal lines n2, n17, n28, n35 and n38.

FIG. 37 shows the cost calculation result (step S93) of each representative signal line. In this case, all of the five representative signal lines are selected as candidate signal lines, because three signal lines cannot be selected from the representative signal lines in descending order of the cost.

FIG. 38 shows the cost calculation result (step S94) of each candidate signal line. Based on the result of FIG. 38, the signal line n35 having the highest cost is selected as a signal line for test-point insertion.

Figure 39:
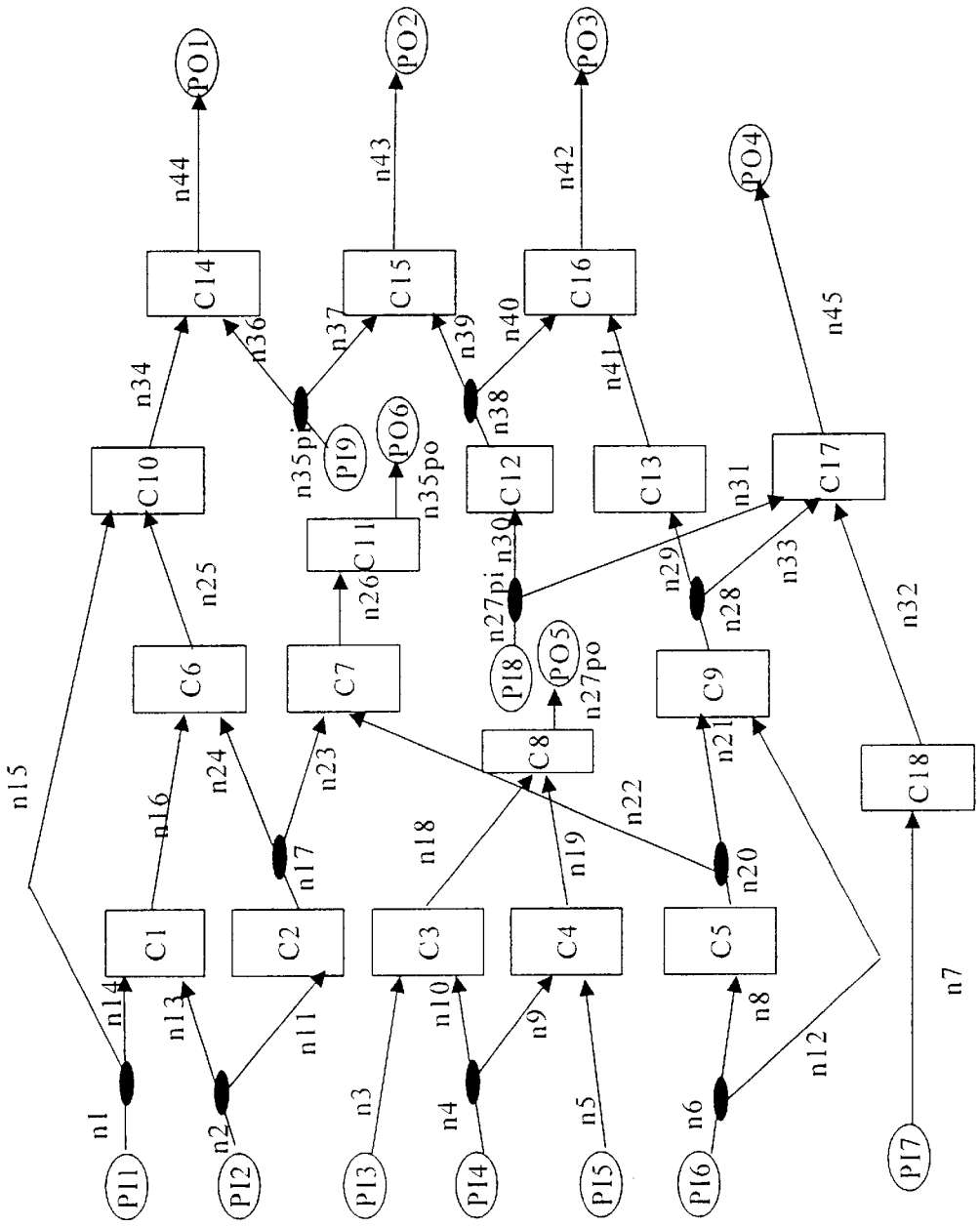
FIG. 39 is a diagram showing a circuit model of the circuit of FIG. 35 having a test point inserted in a signal line n35.
Figure 41:
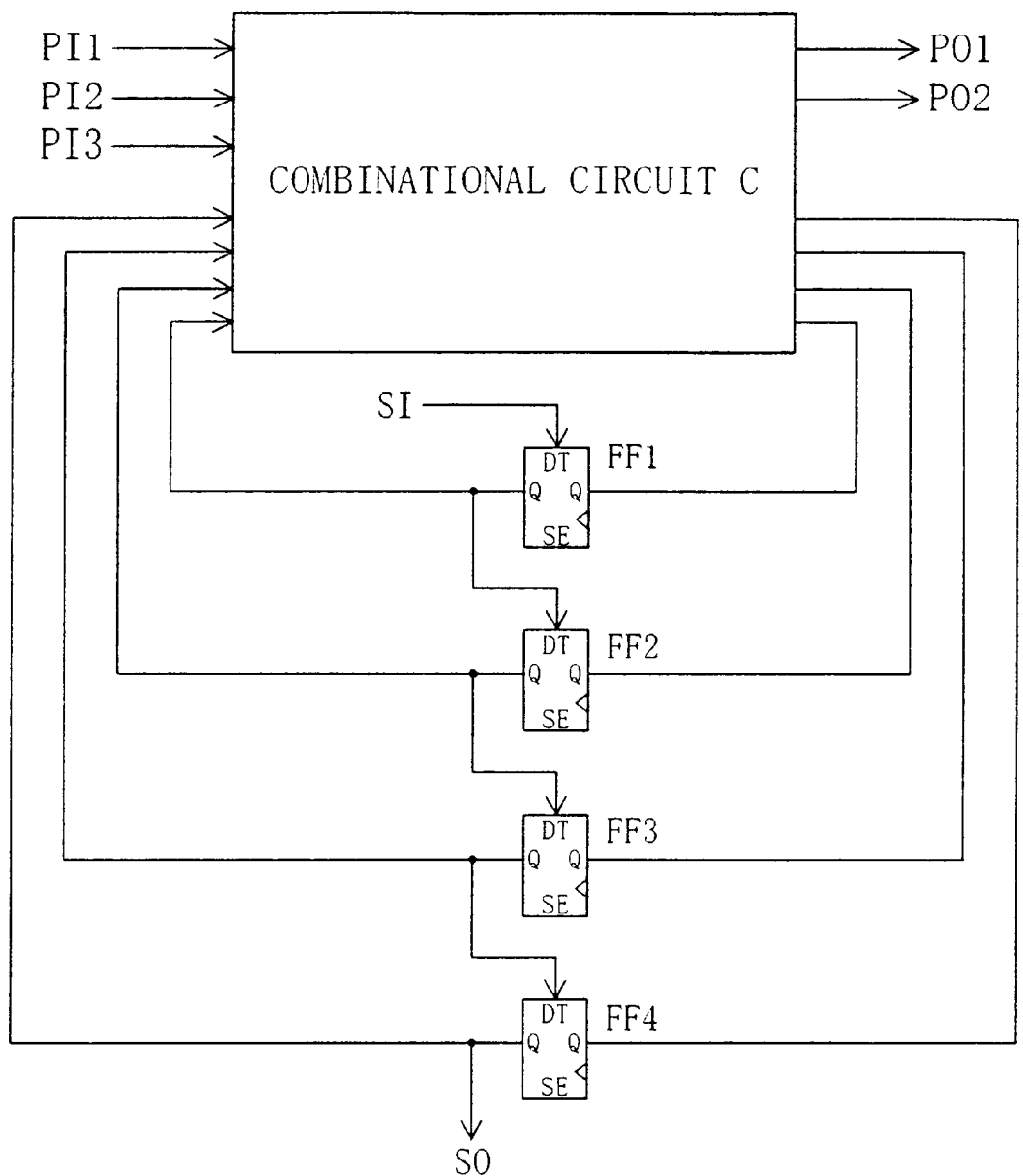
FIG. 41 is a diagram schematically showing an example of a full-scan circuit.
Figure 42:
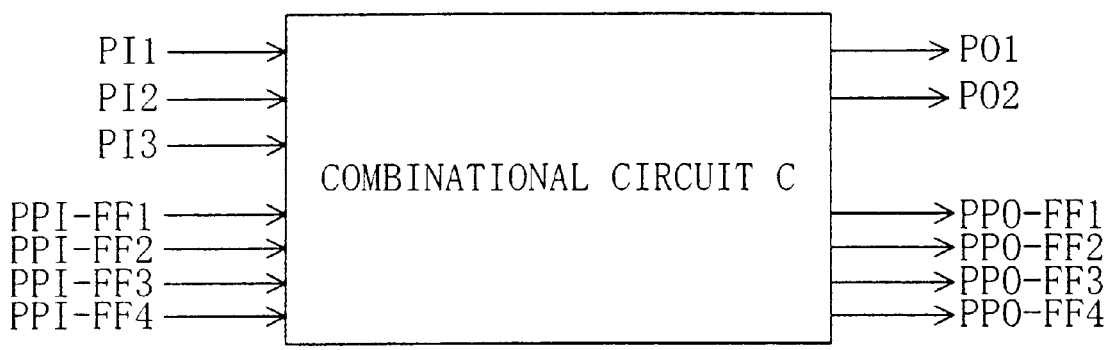
FIG. 42 is a diagram showing a test input pattern generation model of the full-scan circuit of FIG. 41.

FIG. 39 shows a circuit model having a test point inserted in the signal line n35. As a result of the test-point insertion, the signal line n35 is divided into n35*pi* and n35*po*, which are respectively connected to a further external input PI9 and a further external output PO6.

FIGS. 40A and 40B show the calculation result of the fault coverage of the external outputs and the value-assignment probability of the external inputs within the circuit of FIG. 39. As can be seen from FIGS. 40A and 40B, the maximum value of the value-assignment probability of the external input can be reduced from 100% to 47.17% as a result of the test-point insertion to the signal lines n27 and n35.

Thus, according to the present embodiment, the signal lines for test-point insertion can be effectively selected with a small computation amount.

As has been described above, according to the present invention, the number of parallel test input patterns as well as the number of scan FFs per scan path can be reduced, whereby the number of test input patterns by the tester for use in testing can be reduced. Accordingly, the test time of an actual integrated circuit can be significantly reduced.

What is claimed is:

1. A method of design for testability for facilitating generation of test input patterns for an integrated circuit, comprising the step of allocating a design for testability on a block-by-block basis of the integrated circuit so as to reduce the number of test input patterns, wherein the step of allocating a design for testability includes:

a first process of obtaining the number of parallel test input patterns of each block, assuming that each block is full-scan designed;

a second process of full-scan designing a block of interest and inserting a test point therein, the block of interest being a block whose number of parallel test input patterns obtained in the first process exceeds a prescribed value; and a third process of full-scan designing a block other than the block of interest.

2. A method of design for testability for facilitating generation of test input patterns for an integrated circuit, comprising the step of allocating a design for testability on a block-by-block basis of the integrated circuit so as to reduce the number of test input patterns, wherein the step of allocating a design for testability includes:

a first process of obtaining the number of parallel test input patterns of each block, assuming that each block is full-scan designed;

a second process of full-scan designing a block of interest, the block of interest being a block having a largest number of parallel test input patterns obtained in the first process; and a third process of partial-scan designing or full-scan designing a block other than the block of interest so that the number of parallel test input patterns of the block does not exceed the number of parallel test input patterns of the block of interest that is obtained in the first process.

3. A method of design for testability for facilitating generation of test input patterns for an integrated circuit, comprising the step of allocating a design for testability on a block-by-block basis of the integrated circuit so as to reduce the number of test input patterns, wherein the step of allocating a design for testability includes:

a first process of obtaining the number of parallel test input patterns of each block, assuming that each block is full-scan designed;

a second process of full-scan designing a block of interest and inserting a test point therein, the block of interest being a block whose number of parallel test input patterns obtained in the first process exceeds a prescribed value;

a third process of obtaining the number of parallel test input patterns of the block of interest; and a fourth process of partial-scan designing or full-scan designing a block other than the block of interest so that the number of parallel test input patterns of the block does not exceed the number of parallel test input patterns of the block of interest that is obtained in the third process.

4. A method of design for testability for facilitating generation of test input patterns for an integrated circuit, comprising the step of allocating a design for testability on a block-by-block basis of the integrated circuit so as to reduce the number of test input patterns, wherein the step of allocating a design for testability includes a process of selecting a design for testability for each block from a respective design-for-testability library according to an evaluation function of test time required for fault testing, each of the respective design-for-testability libraries of the blocks storing a plurality of designs for testability and result information indicating results of the designs for testability.

5. The method of design for testability according to claim 4, wherein each of the design-for-testability libraries stores as the result information the number of scan FEs (flip-flops) and the number of parallel test input patterns.

6. The method of design for testability according to clair 5, wherein the evaluation function is a product of a sum of the respective numbers of scan FEs of the blocks and a maximum value of the number of parallel test input patterns of the blocks.

7. A method of design for testability for facilitating generation of test input patterns for a partially scanned integrated circuit, comprising:
 a first process of finding, for each input of a plurality of blocks, which is connected in common to an output of a same block in the integrated circuit, a flip-flop that is accessible from the input only through a combinational circuit and is not a scan flip-flop, as well as calculating the number of such flip-flops for each input;
 a second process of selecting from the inputs connected to the output of the same block an input having a largest number of flip-flops obtained in the first process; and
 a third process of replacing every flip-flop found in the first process with a scan flip-flop, the third process being conducted for each of the inputs other than that selected in the second process.

8. A method of design for testability for facilitating generation of test input patterns for an integrated circuit, comprising the step of, when the integrated circuit isa combinational circuit or a full-scan design circuit, or when a block forming the integrated circuits is a combinational circuit or a full-scan design circuit, determining a test-point position so as to reduce the number of parallel test input patterns of the integrated circuit or the block, wherein a test circuit is inserted at the test-point position determined in the step,
 wherein the step of determining a test-point position includes a first process of, when a plurality of selected external outputs have a common accessible external input, determining the test-point position so as to make only one of the plurality of external outputs accessible to the external input.

9. The method of design for testability according to claim 8 wherein the step of determining a test-point position includes as a pre-process a process of calculating a fault coverage of each external output of the integrated circuit or the block, wherein the external output of the first process is selected based on the calculated fault coverage.

10. The method of design for testability according to claim wherein the step of determining a test-point position includes as a pre-process a process of calculating the number of external inputs accessible from each external output of the integrated circuit or the block, wherein the external output of the first process is selected based on the calculated number of accessible external inputs.

11. A method of design for testability for facilitating generation of test input patterns for an integrated circuit, comprising the step of, when the integrated circuit is a combinational circuit or a fuil-scan design circuit, or when a block forming the integrated circuits is a combinational circuit or a full-scan design circuit, determining a test-point position so as to reduce the number of parallel test Input patterns of the integrated circuit or the block, wherein a test circuit is inserted at the test-point position determined in the step,
 wherein the step of determining a test-point position includes a first procm of, when the number of external inputs accessible from a selected external output is equal to or larger than a prescribed value, determining the test-point position so as to make the number of accessible external inputs smaller than the prescribed value.

12. A method of design for testability for facilitating generation of test input patterns for an integrated circuit, comprising the step of, when the integrated circuit is a combinational circuit or a full-scan design circuit, or when a block forming the integrated circuits is a combinational circuit or a full-scan design circuit, determining a test-point position so as to reduce the number of parallel test input patterns of the integrated circuit or the block, wherein a test circuit is inserted at the test-point position determined in the step, wherein the step of determining a test-point position determines the test-point position so as to make a maximum value of a value-assignment probability of an external input smaller than a prescribed value.

13. A method of design for testability for facilitating generation of test input patterns for an integrated circuit, comprising the step of, when the integrated circuit is a combinational circuit or a full-scan design circuit, or when a block forming the integrated circuits is a combinational circuit or a full-scan design circuit, determining a test-point position so as to reduce the number of parallel test input patterns of the integrated circuit or the block, wherein a test circuit is inserted at the test-point position determined in the step,
 wherein the step of determining a test-point position includes:
  a first process of calculating a fault coverage of each external output of the integrated circuit or the block; and
  a second process of calculating as a value-assignment probability of each external input, a sum of the respective fault coverage of the external outputs accessible from the external input which are calculated in the first process, and
 wherein the test-point position is determined so that a value-assignment probability of each external input becomes lower when a signal line having a test point inserted therein is regarded as an external input/output.

14. The method of design for testability according to claim 13, wherein a position that results in a smallest maximum value of the value-assignment probability of the external input upon tentative insertion of the test point is preferentially determined as the test-point position.

15. The method of design for testability according to claim 13 wherein the step of determining a test-point position includes:
 a first process of calculating a fault coverage of each external output and a value-assignment probability of each signal line;
 a second process of selecting candidate signal lines for test-point insertion from representative signal lines, based on the calculation result of the first process; and
 a third process of selecting a signal line for test-point insertion from the candidate signal lines selected in the second process.

16. The method of design for testability according to claim 15, wherein the representative signal lines are fan-out stems.

17. The method of design for testability according to claim 17, wherein the representative signal lines are fan-out stems and have a value-assignment probability higher than a maximum value of the fault coverage of the external output as well as lower than a maximum value of the value-assignment probability of the external input.

18. The method of design for testability according to claim 16, wherein the second process is a process of calculating a cost of each representative signal line and preferentially selecting representative signal lines having a larger cost value as the candidate signal lines, wherein the cost is calculated by the substeps of:

obtaining a set of external outputs accessible to the representative signal line;

obtaining, for each external output of the set, a sum of differences between a prescribed threshold value of the value-assignment probability and the respective value-assignment probabilities of the external inputs that are accessible to the external output and have a value-assignment probability equal to or higher than the threshold value; and calculating as a cost value a sum of the respective sums of the external outputs of the set.

19. The method of design for testability according to claim 15, wherein the third process is a process of calculating a cost of each candidate signal line and preferentially selecting a candidate signal line having a larger cost value as the signal line for test-point insertion, wherein the cost is calculated by the substeps of:

obtaining a set of external inputs accessible to the candidate signal line and having a value-assignment probability equal to or higher than a prescribed threshold value;

obtaining a reduction amount for each external input of the set, the reduction amount being a sum of the respective fault coverage of the external outputs that become no longer accessible from the external input upon disconnecting the candidate signal; and calculating as a cost value a sum of the respective reduction amounts of the external inputs of the set.

20. An integrated circuit comprising:

a test circuit which has a first scan flip-flop and a two-input selector, and which is inserted in a signal line, and a second scan flip-flop for controlling a selection signal line of the two-input selector, wherein the second scan flip-flop is formed so that its data input is fixed to a value of a selection signal for a normal operation of the two-input selector and a reset value of the second scan flip-flop at its reset input disabled during scan testing.

21. An integrated circuit comprising:

a test circuit which has a first scan flip-flop and a two-input selector, and which is inserted in a signal line, and a second scan flip-flop for controlling a selection signal line of the two-input selector, wherein the second scan flip-flop is formed so that its data input is connected to another signal line and a reset value of the second scan flip-flop at its reset input is disabled during scan testing.

22. A design method for an integrated circuit, comprising the step of selecting a design for testability for each functional block of the integrated circuit from a respective design-for-testability library according to an evaluation function of test time required for fault testing, each of the respective design-for-testability libraries of the functional blocks storing a plurality of designs for testability and result information indicating results of the designs for testability, wherein at least one of the plurality of designs for testability require inserting a test circuit into a corresponding functional block so as to reduce of parallel test input patterns of the corresponding functional block.

* * * * *

UNITED STATES PATENT AND TRADEMARK OFFICE
CERTIFICATE OF CORRECTION

PATENT NO. : 6,708,315 B2
DATED : March 16, 2004
INVENTOR(S) : Toshinori Hosokawa et al.

It is certified that error appears in the above-identified patent and that said Letters Patent is hereby corrected as shown below:

Title page, Item [54] and Column 1, lines 1-3,
Title, change "METHOD OF DESIGN FOR TESTABILITY, METHOD OF DESIGN FOR INTEGRATED CIRCUITS AND INTEGRATED CIRCUITS" to -- A METHOD OF TESTING AN INTEGRATED CIRCUIT ON A FUNCTIONAL BLOCK BY FUNCTIONAL BLOCK BASIS --;

Column 27,
Lines 53-54, change "according to claim wherein" to -- according to claim 8 --;

Column 28,
Lines 65-66, change "according to claim 17" to -- according to claim 15 --;

Column 29,
Lines 5-6, change "according to claim 16" to -- according to claim 15 --;

Column 30,
Lines 10-11, change "reset input disabled" to -- reset input is disabled --.

Signed and Sealed this

Third Day of August, 2004

JON W. DUDAS
*Acting Director of the United States Patent and Trademark Office*